United States Patent
Shah et al.

(10) Patent No.: US 10,026,483 B1
(45) Date of Patent: Jul. 17, 2018

(54) PROGRAM TEMPERATURE AWARE DATA SCRUB

(71) Applicant: Western Digital Technologies, Inc., San Jose, CA (US)

(72) Inventors: Grishma Shah, Milpitas, CA (US); Philip David Reusswig, Mountain View, CA (US); Chris Nga Yee Yip, Saratoga, CA (US); Nian Niles Yang, Mountain View, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/636,023

(22) Filed: Jun. 28, 2017

(51) Int. Cl.
*G11C 16/04* (2006.01)
*G11C 16/16* (2006.01)
*G11C 16/26* (2006.01)
*G11C 16/08* (2006.01)

(52) U.S. Cl.
CPC .............. *G11C 16/16* (2013.01); *G11C 16/08* (2013.01); *G11C 16/26* (2013.01)

(58) Field of Classification Search
CPC .......... G11C 16/16; G11C 16/08; G11C 16/26
USPC .................................................. 365/185.11
See application file for complete search history.

(56) References Cited

U.S. PATENT DOCUMENTS

| 7,460,407 | B2 | 12/2008 | Mokhlesi et al. |
| 8,611,157 | B2 | 12/2013 | Dutta |
| RE45,700 | E | 9/2015 | Dutta |
| 9,165,668 | B1 | 10/2015 | Zhao et al. |
| 9,530,512 | B2 | 12/2016 | Ray et al. |
| 9,543,028 | B2 | 1/2017 | Ray et al. |
| 9,595,347 | B2 | 3/2017 | Zhao et al. |
| 2009/0290428 | A1 | 11/2009 | Noh |
| 2009/0323412 | A1* | 12/2009 | Mokhlesi ............ G11C 11/5642 365/185.02 |
| 2010/0329026 | A1 | 12/2010 | Nakamura et al. |
| 2011/0205823 | A1 | 8/2011 | Hemink et al. |
| 2011/0289386 | A1* | 11/2011 | Yang ..................... G06F 11/106 714/764 |
| 2014/0317460 | A1* | 10/2014 | Kleveland .............. G11C 29/44 714/710 |
| 2016/0093387 | A1* | 3/2016 | Oh ........................ G11C 16/16 365/185.11 |

* cited by examiner

Primary Examiner — Tha-O H Bui
(74) Attorney, Agent, or Firm — Vierra Magen Marcus LLP

(57) ABSTRACT

Techniques disclosed herein cope with cross-temperature effects in non-volatile memory systems. One technology disclosed herein includes an apparatus and method that scrubs a block of non-volatile memory cells responsive to a determination that variance in word line program temperatures in the block exceeds a threshold. Such blocks having large variance in programming temperatures for different word lines can potentially have high BERs when reading. This may be due to the difficulty in having one set of read levels that are optimum for all word lines in the block.

20 Claims, 18 Drawing Sheets

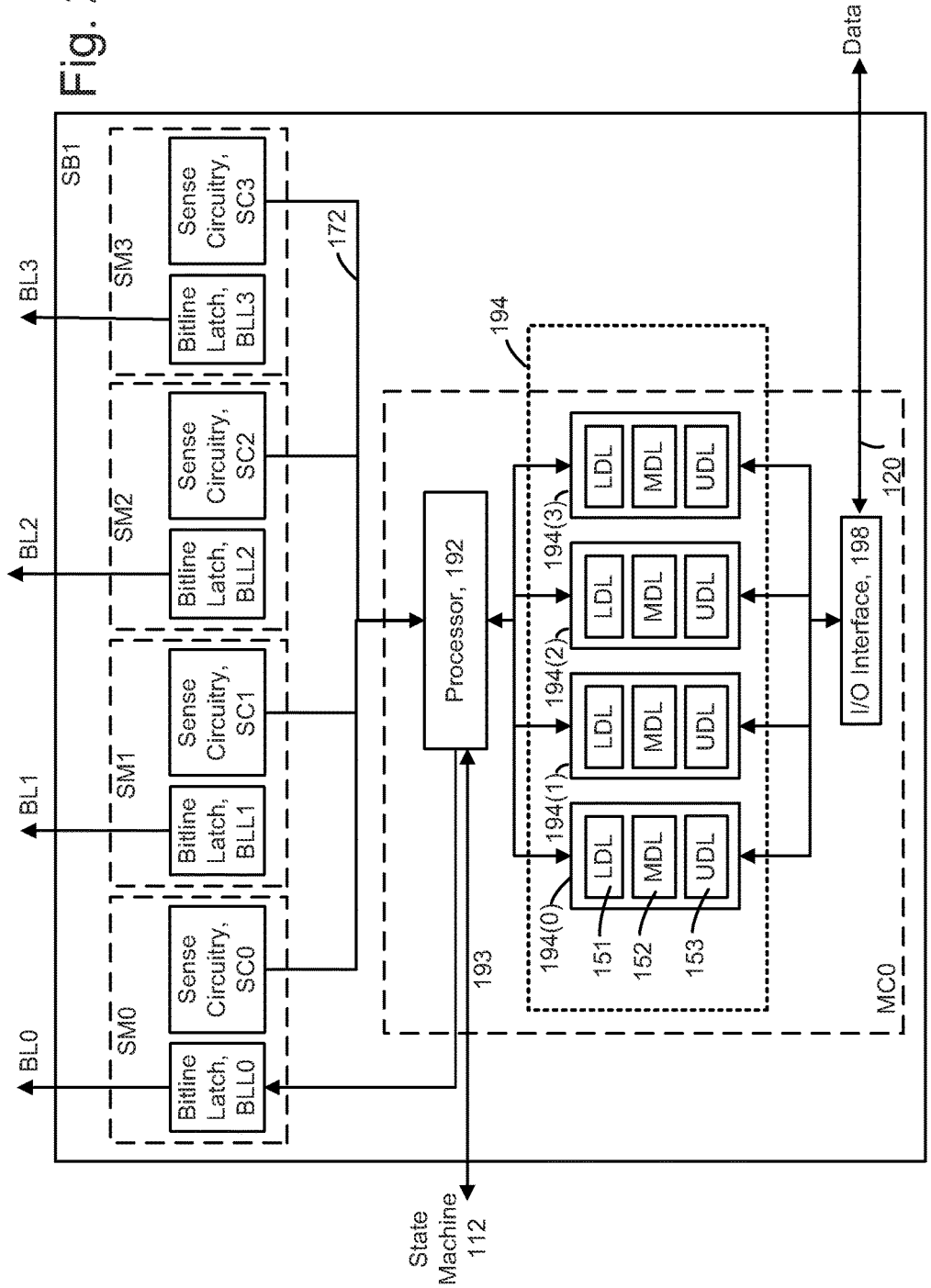

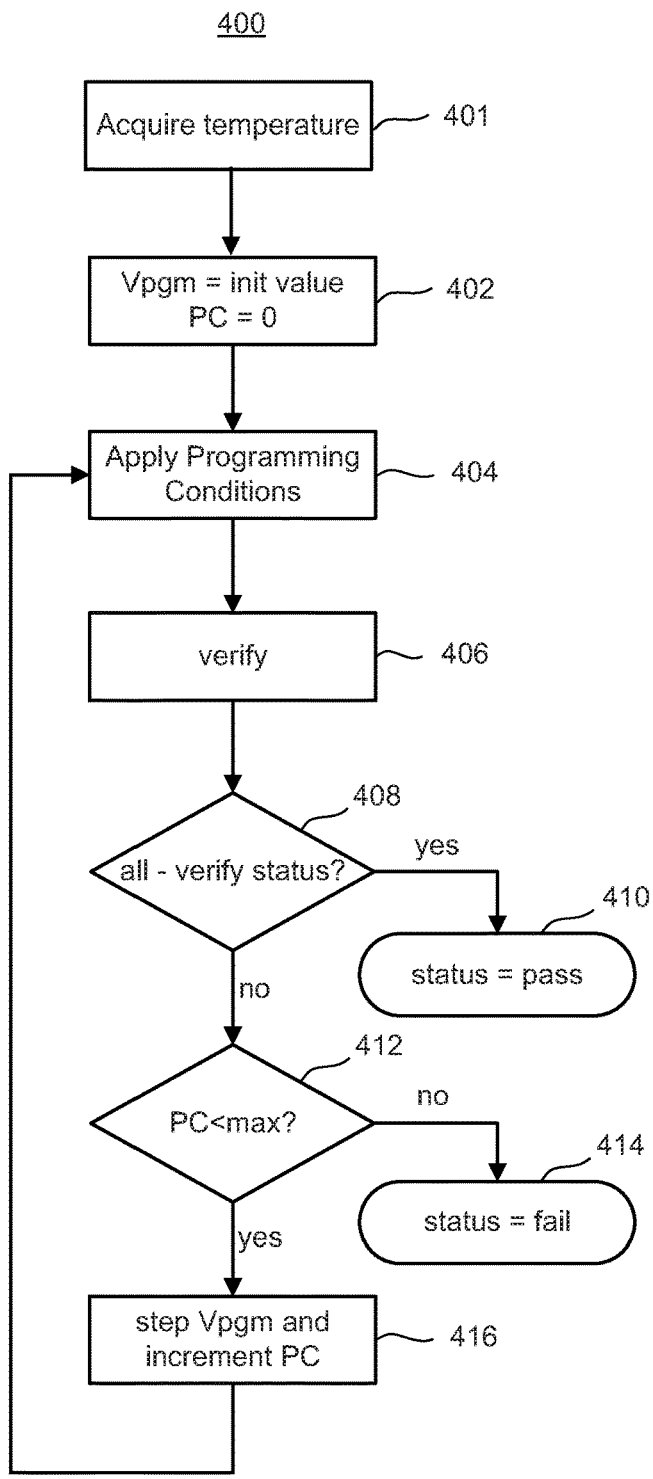

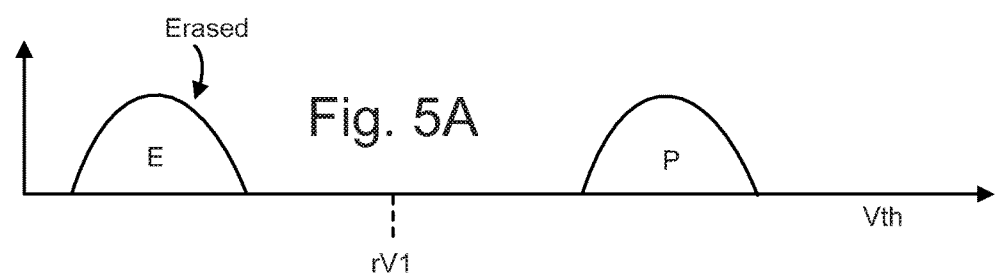
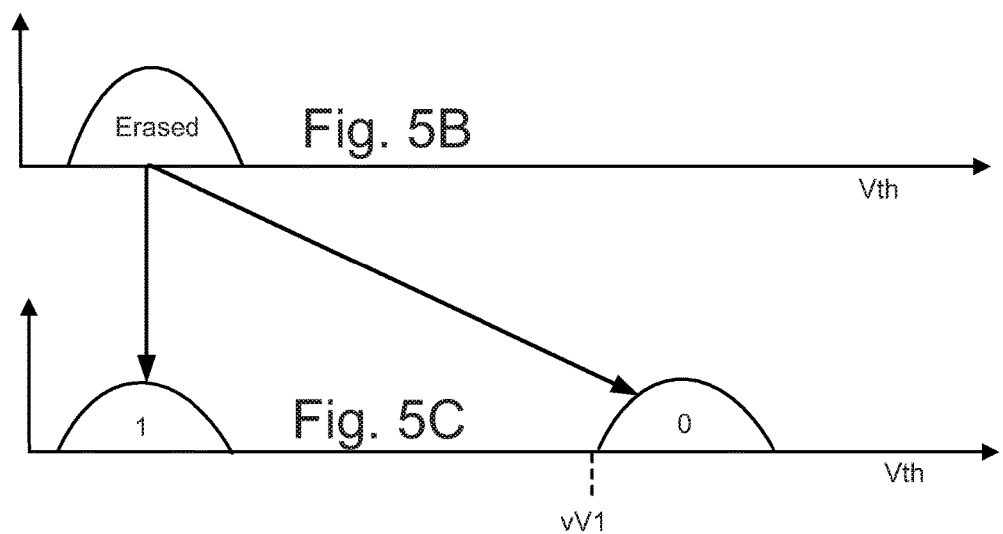

First programming pass

Second programming pass

US 10,026,483 B1

PROGRAM TEMPERATURE AWARE DATA SCRUB

BACKGROUND

The present technology relates to non-volatile memory systems.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a conductive floating gate or a non-conductive charge-trapping material can be used in some types of memory cells to store a charge which represents a data state. The memory cell may be a transistor in which the charge-storing material may reside between a channel and a control gate. The charge-storing material may be insulated from both the channel and the control gate. The charge-storing material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

Some types of memory cells may be programmed by altering the charge in the charge-storing material, thereby altering the threshold voltage (Vth) of the memory cell transistor. In one technique, a program voltage is applied to the control gate with a low voltage in the channel to add charge to the charge-storing material. After applying the program voltage, the memory cell's threshold voltage is tested by applying a verify voltage to the control gate, and testing whether the memory cell conducts a significant current. Additional program voltages may be applied to control gate, followed by verify voltages, until the memory cell's threshold current is within a target range.

Other types of memory cells can be programmed to different resistance levels. For example, resistive random access memory (ReRAM) can be reversibly switched between a high resistance state and a low resistance data state. In some memory cells, a ReRAM cell can be reversibly switched between more than two different resistance states. Each resistance state can correspond to a range of resistances.

A memory cell may be read by applying one or more read reference signals to it to determine what range its threshold voltage, resistance, or other physical property falls within. Often, memory cells are programmed in a basic unit referred to as a "page." The page contains user data and overhead data, in some techniques. Overhead data typically includes parity bits of an Error Correction Code (ECC) that have been calculated from the user data. An error correction controller (ECC) engine encodes user data by adding the parity bits to form a codeword. The ECC engine decodes and error corrects the codeword read from the non-volatile memory system.

BRIEF DESCRIPTION OF THE DRAWINGS

FIG. 2B is a block diagram depicting one embodiment of the sense block SB 51 of FIG. 1A.

FIG. 4 is a flowchart describing one embodiment of a programming process, which includes one or more verification steps.

FIG. 5A-5C illustrate an example of a population of two-state memory cells (Single Level Cells, or "SLC" cells).

DETAILED DESCRIPTION

Figure 1A:
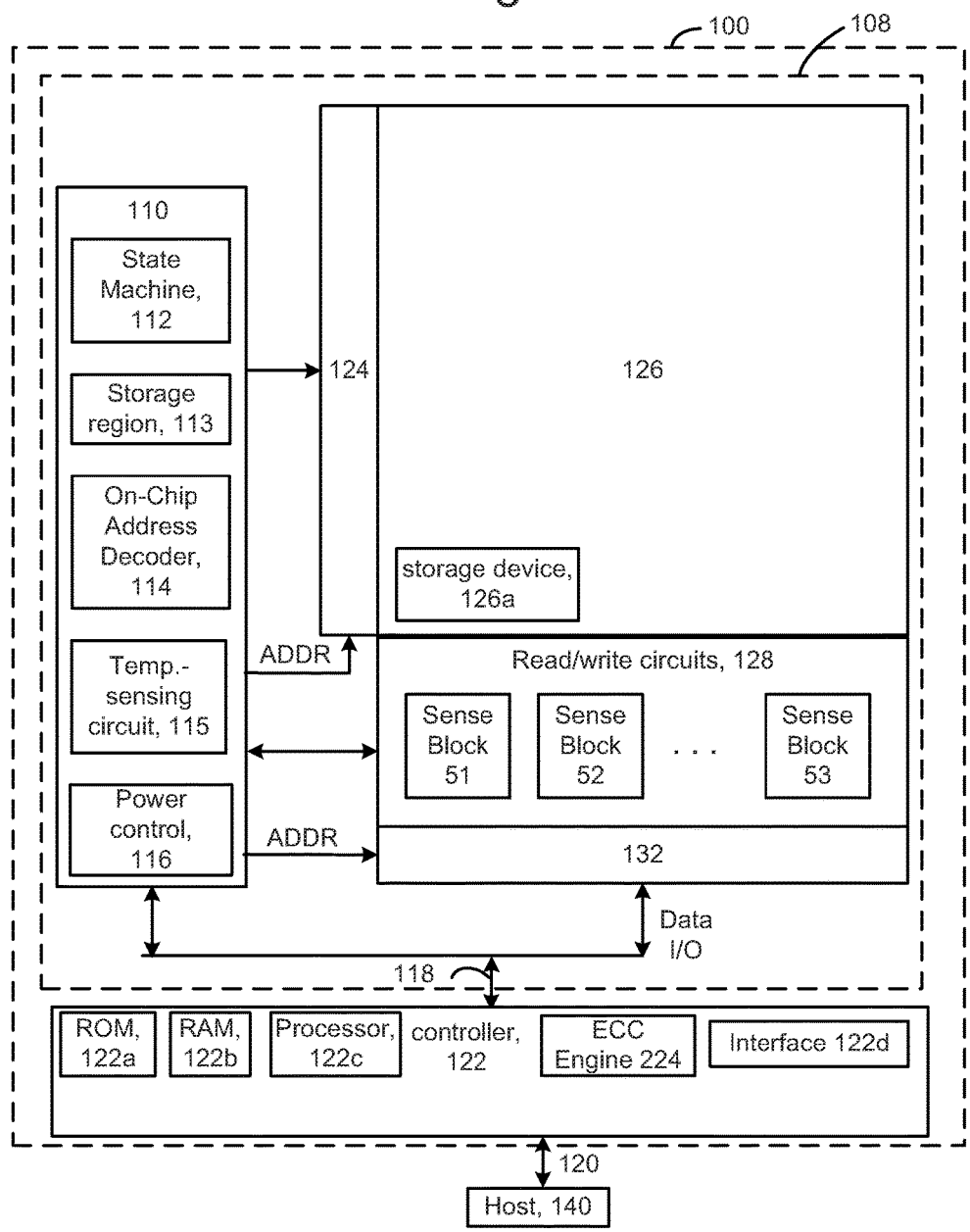
FIG. 1A is a functional block diagram of a memory system in which embodiments may be practiced.

The present technology pertains to operating non-volatile memory systems. Technology disclosed herein copes with cross-temperature effects in non-volatile memory systems.

Many types of non-volatile memory cells exhibit temperature dependent effects with respect to their data state. For example, some memory cells are programmed by storing charge in either a floating gate or charge trapping region. Typically, the threshold voltage (Vth) of such a memory cell varies with temperature. Thus, if a memory cell is programmed to a certain charge level at one temperature and read at a different temperature, even if the memory cell retains the programmed charge level the threshold voltage may be different. Herein, the difference between the program temperature and the read temperature is referred to as "cross-temperature."

Examples are described herein of cross-temperature effects (and technological solutions are disclosed herein) in which the memory cells store charge to control the threshold voltage of the memory cell. However, cross-temperature effects (and technological solutions disclosed herein) are not limited to memory cells that store charge to control the threshold voltage. For example, non-volatile memory cells for which a data state is represented by resistance may also exhibit cross-temperature effects. Furthermore, non-volatile memory cells for which a data state is represented by a physical property other than threshold voltage or resistance may also exhibit cross-temperature effects.

The optimum read levels for reading a page of data may depend on temperature. Note that the optimum read levels may depend not only on the present temperature, but also on the program temperature. In other words, the optimum read levels may depend on cross-temperature. If the memory system does not compensate for a large cross-temperature, the bit error rate (BER) may increase. The throughput of the ECC engine may correlate strongly with the BER. For example, the ECC engine may run an algorithm that takes longer to converge when the BER is higher. Thus, large cross-temperatures can decrease memory system performance (e.g., throughput). One challenge is that different word lines in a block can be programmed at different temperatures. Thus, the cross-temperature can be different for different word lines in a block. This can present problems, such as efficiently having optimum read voltages for different word lines in the same block.

One embodiment disclosed herein includes an apparatus and method that scrubs a block of non-volatile memory cells responsive to a determination that variance in word line program temperatures in the block exceeds a threshold. Scrubbing a block refers to re-writing the data that is stored in the block. Such blocks having large variance in programming temperatures for different word lines can potentially have high bit error rates (BERs) when reading. This may be due to one set of read voltage levels not being optimum for all word lines in the block.

One embodiment disclosed herein includes an apparatus and method that records a temperature code into spare non-volatile memory cells on a selected word line. The temperature code is for the temperature at which user data was programmed into non-volatile memory cells on the selected word line. Each word line in a block may have such a temperature code. However, reading back such a temperature code from the spare non-volatile memory cells can present problems in the event there is a large cross temperature. One embodiment disclosed herein includes an apparatus and method that records the temperature code in a robust manner such that the temperature code can be accurately read, even when there is an extreme cross temperature. Moreover, the temperature code may be programmed into the spare non-volatile memory cells at the same time that user data is programmed on the same word line at multiple bits per memory cell. For example, the temperature code can be programmed using the same programming voltages that are used to program the user data.

One embodiment disclosed herein includes an apparatus and method that first attempts to read non-volatile memory cells associated with a selected word line in a block using read levels that are common to all word lines in the block. A temperature code may be read from spare memory cells on the selected word line at the same time that the user data is read. For example, the temperature code may be read using one or more of the read voltages that are applied to the selected word line to read the user data. In the event that decoding the user data fails, the memory cells on the selected word line may be sensed again, using adjusted read voltage levels that are determined based on the cross temperature. Using the adjusted read levels can reduce the BER, and speed the decode process.

FIG. 1A is a block diagram of an example memory system 100 in which embodiments may be practiced. The memory system 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory system 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The control circuitry 110 may include a temperature-sensing circuit 115 which may be used by the state machine 112 to determine a present temperature. In one embodiment, the temperature-sensing circuit 115 outputs a temperature code, which may be a binary string. The temperature code could have any number of bits, such as five bits, eight bits, etc. The temperature-sensing circuit 115 could, alternatively, be located off the memory die 108, in the controller 122.

In one embodiment, temperature-sensing circuit 115 senses a temperature at which memory cells on a selected word line are programmed. A temperature code for this temperature may be stored in memory cells on the selected word line. In one embodiment, storage region 113 contains registers for storing the temperature codes, at least temporarily. One register is used to store a temperature code for the present temperature on the memory die, in one embodiment. One or more registers are used to store a temperature code(s) that is read from memory cells on a word line(s), in one embodiment. In one embodiment, the controller 122 sends a first status command to the memory die 108 to retrieve a temperature code for the present temperature. In one embodiment, the controller 122 sends a second status command to the memory die 108 to retrieve a temperature code for the temperature at which a selected word line was programmed.

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth. The control circuit may also be referred to as a managing circuit.

The off-chip controller 122 (which in one embodiment is an electrical circuit) may comprise a processor 122c, storage devices (memory) such as ROM 122a and RAM 122b and an error-correction code (ECC) engine 224. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate). In one embodiment, vertically orientated NAND strings extend perpendicular to the major surface of the substrate.

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
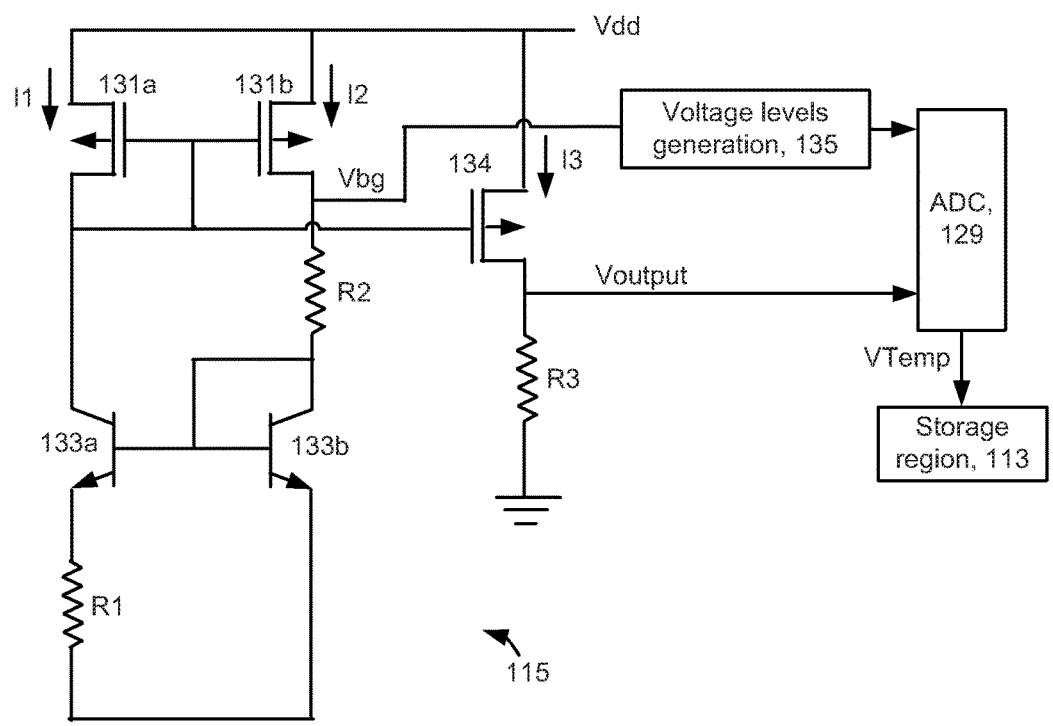
FIG. 1B depicts an example of a temperature-sensing circuit, which may be used in the memory system of FIG. 1A.

FIG. 1B depicts an example of a temperature-sensing circuit 115, which may be used in the memory system 100 of FIG. 1A. In this example, the temperature-sensing circuit 115 stores a temperature code in storage region 113. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the storage region 113. This is data indicating a temperature of the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2A:
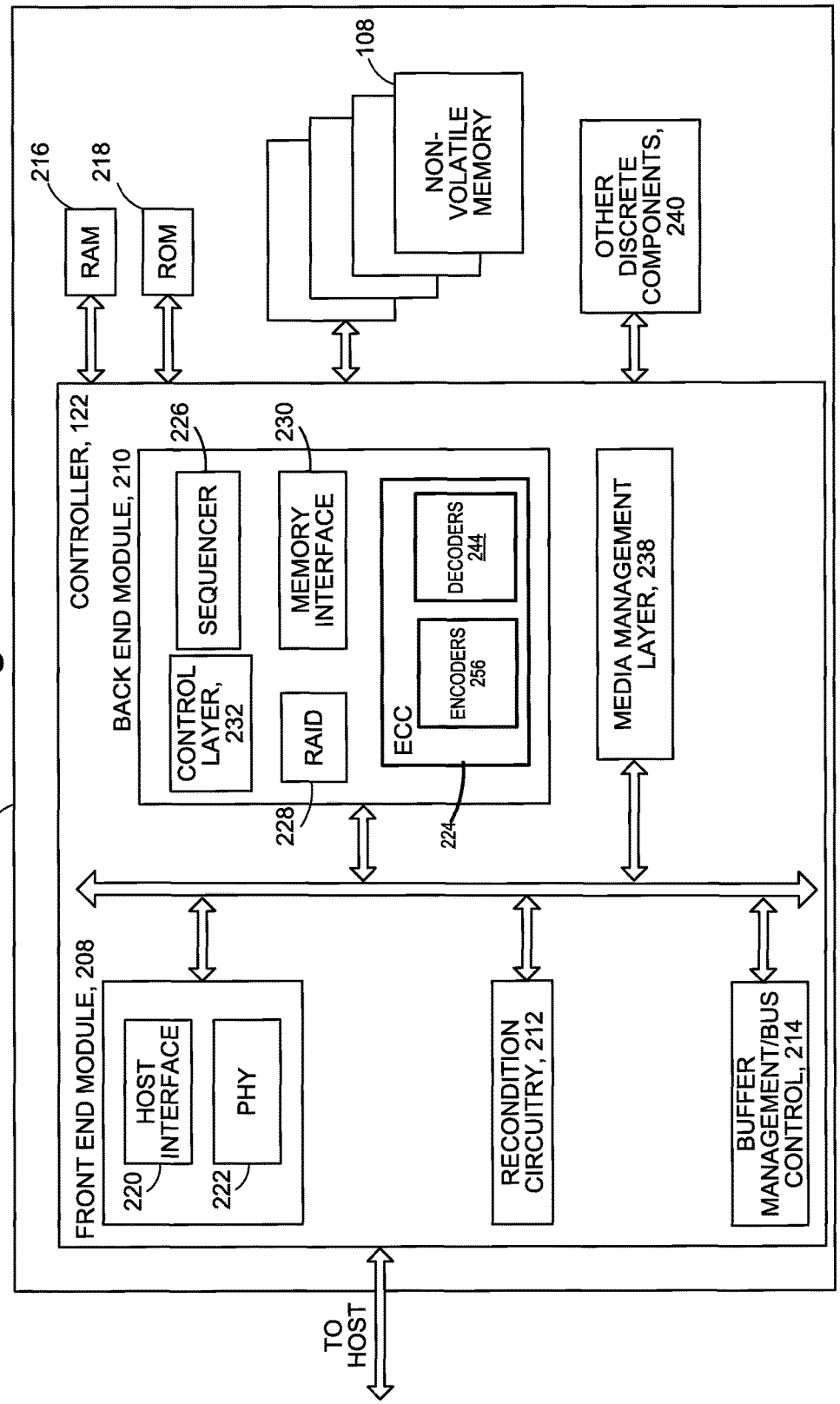
FIG. 2A is a block diagram of the example memory system 100, depicting additional details of the controller 122 of FIG. 1A.

FIG. 2A is a block diagram of the example memory system 100, depicting additional details of the controller 122. In one embodiment, the controller 122 is a flash controller. As used herein, a memory controller is a device that manages data stored on memory and communicates with a host, such as a computer or electronic device. A memory controller can have various functionality in addition to the specific functionality described herein. For example, the memory controller can format the memory to ensure the memory is operating properly, map out bad memory cells, and allocate spare memory cells to be substituted for future failed cells. Some part of the spare cells can be used to hold firmware to operate the memory controller and implement other features. In operation, when a host needs to read data from or write data to the memory, it will communicate with the memory controller. If the host provides a logical address to which data is to be read/written, the memory controller can convert the logical address received from the host to a physical address in the memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable interface. In one embodiment, memory system 100 may be a card based system, such as a secure digital (SD) or a micro secure digital (micro-SD) card. In an alternate embodiment, the memory system may be part of an embedded memory system. For example, the memory may be embedded within the host, such as in the form of a solid state disk (SSD) drive installed in a personal computer.

In some embodiments, the memory system 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2A is one example implementation that may (or may not) use the components of the controller 122 depicted in FIG. 1A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2A as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. The ECC engine 224 has one or more decoders 244 and one or more encoders 256. In one embodiment, the ECC engine 224 comprises a low-density parity check (LDPC) decoder. In one embodiment, the decoders 244 include a hard decoder and a soft decoder. An output of one or more decoders 244 may be provided to the host.

A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A control layer 232 controls the overall operation of back end module 210.

Additional components of memory system 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Media Management Layer (MML) 238 may be integrated as part of the management that may handle errors and interfacing with the host. In one embodiment, MML 238 is a Flash Translation Layer (FTL). MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory system 100) implement a solid state drive (SSD), which can emulate, replace or be used instead of a hard disk drive inside a host, as a network-attached storage (NAS) device, and so forth. Additionally, the SSD need not be made to work as a hard drive.

FIG. 2B is a block diagram depicting one embodiment of one of the sense blocks (e.g., SB 51) of FIG. 1A. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194(0), 194(1), 194(2) and 194(3) and an I/O interface 198 coupled between the sets of data latches 194 and the data bus 120. In this example, each set of latches is associated with one of the bit lines. For example, data latches 194(0) are associated with bit line BL0, data latches 194(1) are associated with bit line BL1, data latches 194(2) are associated with bit line BL2, and data latches 194(3) are associated with bit line BL3. Each set of data latches includes data latches identified by LDL 151, MDL 152, and UDL 153, in this embodiment. LDL 151 stores a bit for a lower page (LP) of write data, MDL 152 stores a bit for a middle page (MP) of write data, and UDL 153 stores a bit for an upper page (UP) of write data, in a memory which stores three bits of data in each memory cell. Note that there may be one set of such latches associated with each bit line. Thus, there may be a page of latches 194 associated with a page of memory cells. The latches 194 may also be used to store data read from the non-volatile memory cells.

Additional or fewer data latches per set could be used as well. For example, in a two-bit per memory cell implementation, the MDL data latch for the middle page (MP) of data is not needed. A four-bit per memory cell implementation can use LDL, LMDL (lower-middle page), UMDL (upper-middle page), and UDL latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., VrA, VrB, Vrc, VrD, VrE, VrF, and VrG in FIG. 6G) corresponding to the various memory states supported by the memory (e.g., states A, B, C, D, E, F, and G), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the data latches 194. For example, the memory state for a memory cell associated with bit line BL0 may be stored in latches 194(0), etc. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the data latches 194 from the data bus 120, in the LDL, MDL, and UDL data latches. For example, the data to be programmed in a selected memory cell associated with bit line BL0 may be stored in latches 194(0), the data to be programmed in a selected memory cell associated with bit line BL1 may be stored in latches 194(1), etc. The programming operation, under the control of the state machine, comprises a series of programming voltage pulses applied to the control gates of the addressed memory cells. Each programming voltage is followed by a read back (verify test) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194 may be implemented as a stack of data latches for each sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3A:
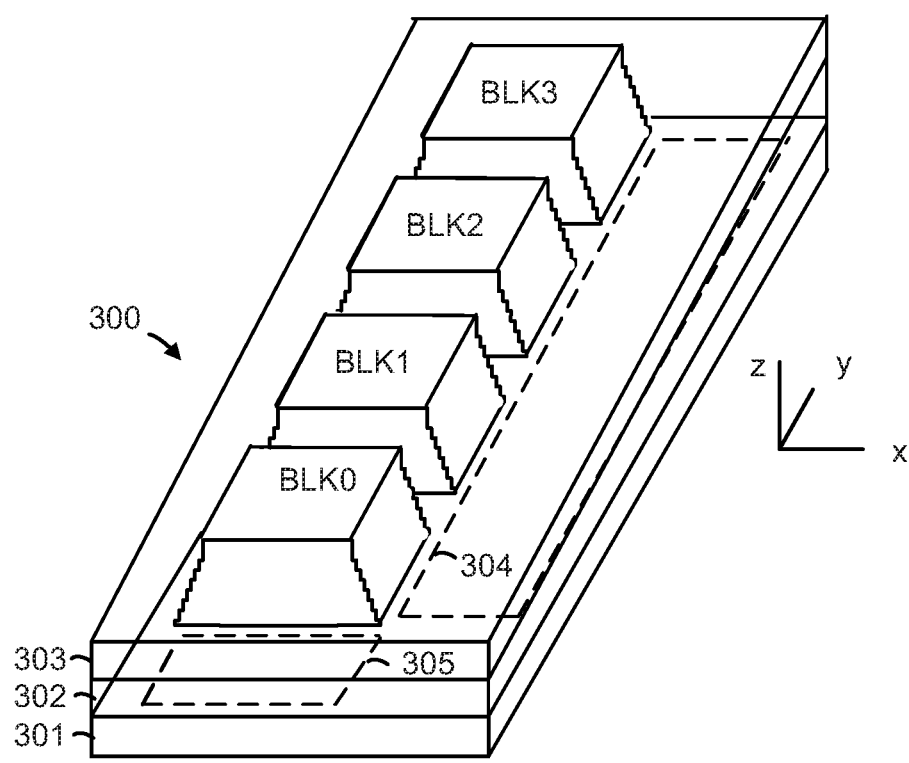
FIG. 3A is a perspective view of a memory device 300 comprising a set of blocks in an example 3D configuration of the memory structure 126 of FIG. 1A.

FIG. 3A is a perspective view of a memory device 300 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The substrate has a major surface that extends in the x-y plane. The blocks may be formed over the major surface. The peripheral area 304 runs along an edge of each block while the peripheral area 305 is at an end of the set of blocks. Each peripheral area can include circuitry, including but not limited to voltage drivers which can be connected to control gate layers, bit lines and source lines of the blocks.

The substrate 301 can also carry circuitry under the blocks, along with one or more lower metal layers which are patterned in conductive paths to carry signals of the circuitry. The blocks are formed in an intermediate region 302 of the memory device. In an upper region 303 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 3B:
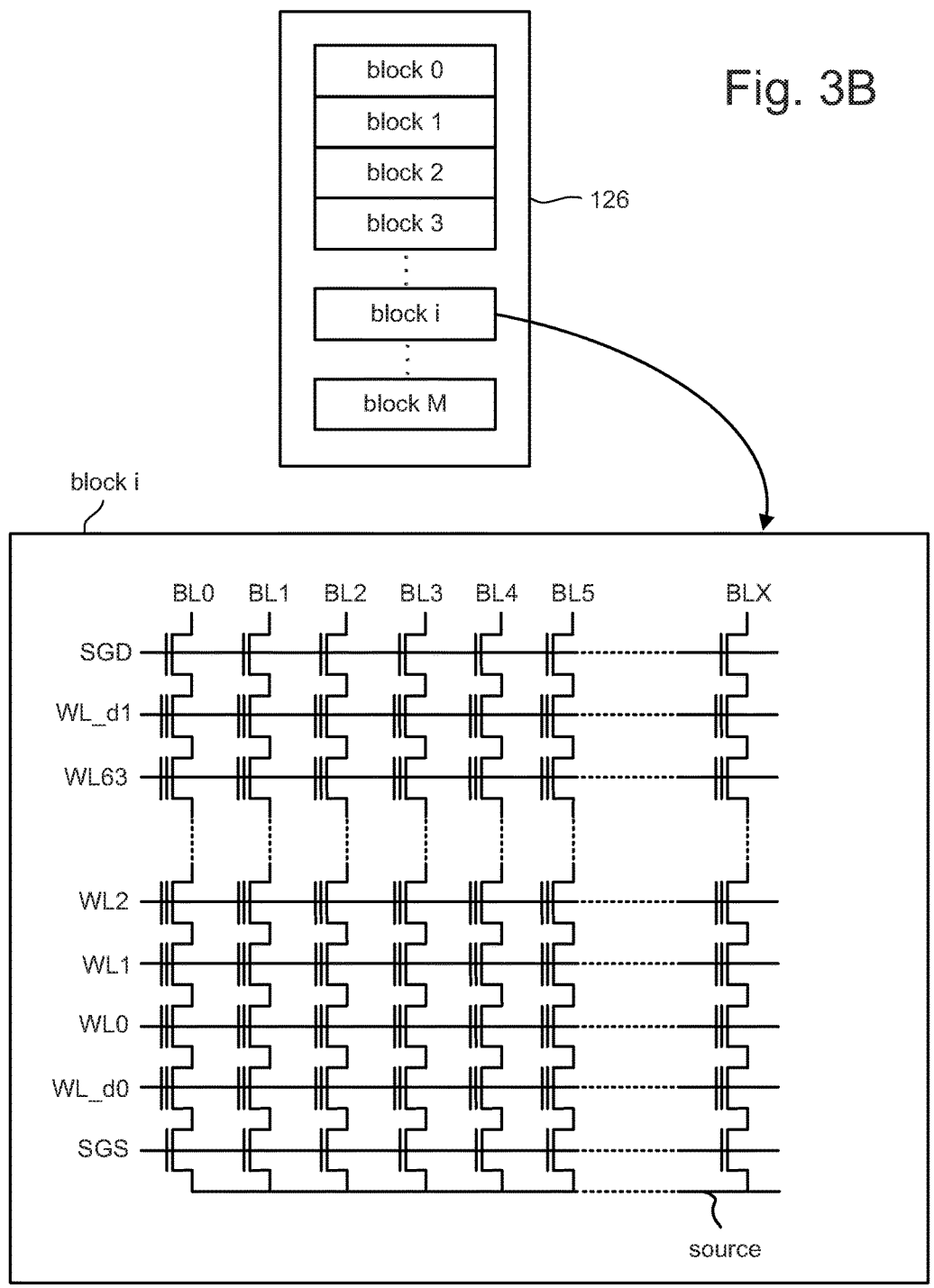
FIG. 3B depicts an exemplary structure of memory cell array 126.

FIG. 3B depicts an exemplary structure of memory cell array 126. In one embodiment, the array of memory cells is divided into M blocks of memory cells. The block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller calculates the ECC parity when data is being programmed into the array, and also checks it when data is being read from the array. Alternatively, the ECCs and/or other overhead data are stored in different pages, or even different blocks, than the user data to which they pertain.

FIG. 3B also shows more details of block i of memory array 126. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

In one embodiment, memory cells on some of the NAND strings are used for storing user data (both user data and ECCs and/or other overhead data), and memory cells on other NAND strings are used for storing memory system information. The memory cells that store used data may be referred to as user memory cells. Note that the user memory cells for a given word line may store what is commonly referred to as a codeword, which may comprise the user data and parity bits. The memory cells that store system data may be referred to as user memory cells. In one embodiment, the temperature codes are stored in system memory cells. Note that the temperature codes are not part of the codeword in such an embodiment. Hence, the temperature code can be read from the system memory cells without the need to read any of the user memory cells.

Figure 3C:
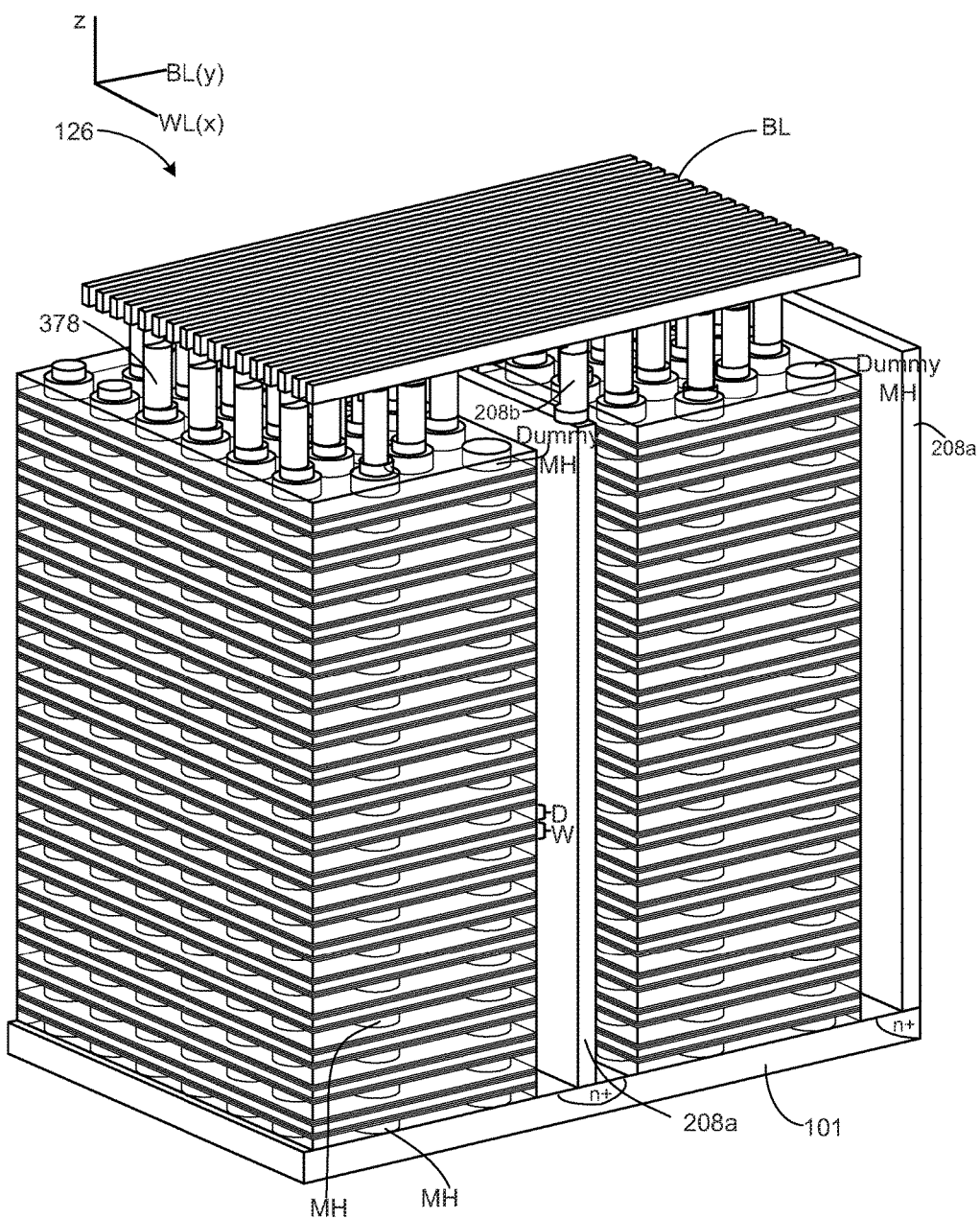
FIG. 3C is a perspective view of a portion of a three dimensional monolithic memory structure.

FIG. 3C is a perspective view of a portion of a three dimensional monolithic memory structure 126, which includes a plurality memory cells. For example, FIG. 3C shows a portion of one block of memory. The structure depicted includes a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. The alternating dielectric layers and conductive layers are divided into "fingers" by local source lines 208a. Note that the local source lines 208a may also be referred to as local interconnects LI. FIG. 3B only shows two fingers and two local interconnects LI. The local source lines 208a are conductive elements. Below and the alternating dielectric layers and word line layers is a substrate 101. Each local source line 208a is in electrical contact with an n+ diffusion region of the substrate 101.

Memory holes are formed in the stack of alternating dielectric layers and conductive layers. For example, one of the memory holes is marked as MH. Note that in FIG. 3B, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. Two of the memory holes, which are not used for data storage, are labeled as dummies (Dummy MH).

A number of bit lines (BL) are depicted over the top of the structure 126. Each bit line is connected to one of the memory holes (other than the Dummy MH) by a bit line contact 378. By providing a voltage to the source line 208b, the local source lines 208a may provide a voltage to the substrate 101. The voltage from the substrate 101 may be provided to the memory cells under control of a source side select line (SGS). In this manner, the local source lines 208a may provide operational voltages to memory cells.

FIG. 4 is a flowchart describing one embodiment of a programming process 400, which includes one or more verification steps. In one embodiment, process 400 is performed in memory system 100 by one or more control circuits (e.g., controller 122, processor 122c, ECC engine 224, state machine 112, on-chip address decoder 114, temp-sensing circuit 115, power control 116, read/write circuits 128, decoders 124, 132, and/or sense block (51, 52, . . . 53). In one embodiment, process 400 is performed in memory system 100 by data programmer 1312, TEMPCODE (temperature code) programmer 1314, and/or temperature sensor 115 depicted in FIG. 13.

Figure 6A:
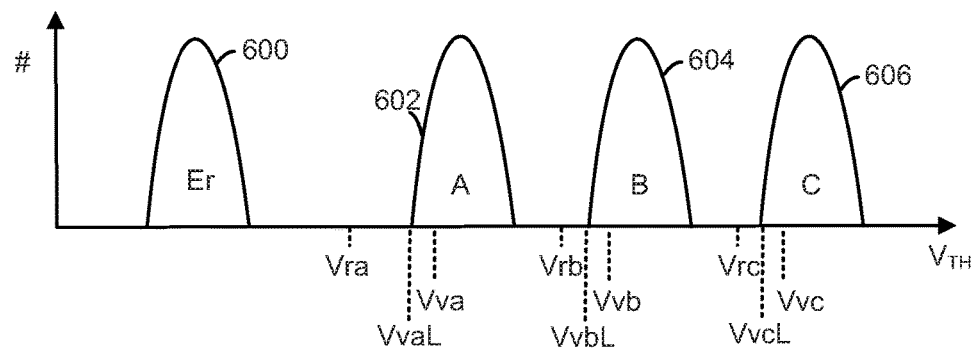
FIG. 6A depicts one embodiment of a set of threshold voltage distributions for a four-state memory device in which each storage element stores two bits of data.

In some embodiments, process 400 is used in a full programming sequence. At the end of a successful programming process (with verification), the threshold voltages of the memory cells should be within one or more distributions of threshold voltages for programmed memory cells or within a distribution of threshold voltages for erased memory cells, as appropriate. Process 400 may be used to program user data and a temperature code into different memory cells on the same word line. FIG. 5C depicts results after one embodiment of process 400 is complete for SLC programming. The two threshold voltage distributions in FIG. 5C may apply for both the user data and the temperature code. FIG. 6A depicts results after one embodiment of process 400 is complete for programming user data using MLC programming. FIG. 6G depicts results after one embodiment of process 400 is complete for programming user data using MLC programming. FIG. 6H depicts results after one embodiment of process 400 is complete for programming a temperature code into spare memory cells on a selected word line at the same time that user data is programmed into other memory cells on the selected word line using MLC programming. Many other possibilities exist for the threshold voltage distributions.

Process 400 is used to program some unit of memory cells. In one embodiment, a basic unit of programming is referred to as a page. In one embodiment, process 400 is used to program "n" physical pages at "n" bits per memory cell. For example, one physical page may be programmed into the unit of memory cells at one bit per cell; two physical pages may be programmed into the unit of memory cells at two bits per cell; three physical pages may be programmed into the unit of memory cells at threes bits per cell, etc. For purpose of discussion, the unit of memory cells may be referred to as a "page" of memory cells or as a "physical page" of memory cells. Note that the temperature code may be programmed in addition to the page of memory cells. For example, the temperature code may be programmed into "spare" or "system" memory cells, whereas the physical page of memory cells may be what is referred to herein as "user memory cells."

In step 401, the present temperature is acquired. In one embodiment, temperature sensing circuit 115 is used to determine the present temperature on the memory die 108. The temperature sensing circuit 115 may store a temperature code in storage region 113, to at least temporarily store the temperature code.

In step 402, the program voltage (Vpgm) is set to an initial value. Also, in step 402, a program counter (PC) is initialized to zero.

In step 404, programming conditions are applied. Step 404 includes applying a program pulse (also referred to as a program voltage) to control gates of the memory cells. For example, Vpgm is applied to a selected word line that is connected to the physical page of memory cells (as well as to the spare memory cells). Thus, note that the selected word line may be connected to both the user memory cells and the system memory cells. Step 404 may also include establishing programming conditions on bit lines. Bit lines associated with memory cells to receive programming may be provided with a program enable voltage; bit lines associated with memory cells to be prevented from programming may be provided with a program inhibit voltage. In one embodiment, the program enable voltage is about 0V. In one embodiment, the program inhibit voltage is about 2 to 3 V. In one full sequence programming embodiment in which three bits are stored per memory cell, all memory cells to be programmed to any of the A-, B-, C-, D-, E-, F- and G-states are initially enabled for programming.

In step 406, a verification process is performed. Step 406 may include applying a voltage to control gates of the physical page of memory cells (as well as the spare memory cells), and determining whether the threshold voltage of the memory cell has reached a target threshold voltage. Referring to FIG. 5C, step 406 applies vV1 to the selected word line in one embodiment of SLC programming. Referring to FIG. 6G, step 406 includes applying one or more of VrA, VrB, VrC, VrD, VrE, VrF, or VrG to the selected word line in one embodiment of MLC programming of user memory cells. Memory cells that pass verify are locked out from further programming, in one embodiment. Locking out from programming may be accomplished by setting data latches (e.g., a set of latches 194 and/or a Bitline Latch BLL0-BLL3) to a value that indicates that the memory cell is to be inhibited from further programming. When step 404 is next performed, the program inhibit conditions are applied to the bit line, instead of the program enable conditions.

In step 408, it is determined whether memory cells have verified that their threshold voltages are at the final target voltage for that memory cell. Note that it is not required that every user memory cell for a given state is verified to be at the appropriate threshold voltage. Error correction is able to correct for some user memory cells being below their target threshold voltage. Error correction is able to correct for some user memory cells being over-programmed. Note that error correction is not used for the temperature code stored in the system memory cells, in some embodiments. Step 408 is referring to all states having completed programming.

If verification passes, the programming process is completed successfully (status=pass) in step 410. If all of the memory cells are not all verified, then it is determined whether the program counter (PC) is less than a maximum value such as 20. If the program counter (PC) is not less than max (step 412), then the program process has failed (step 414). If the program counter (PC) is less than a maximum value (e.g., 20), then the program counter (PC) is incremented by 1 and the program voltage (Vpgm) is stepped up to the next pulse in step 416. Subsequent to step 416, the process loops back to step 404 and the next program pulse is applied to the memory cells.

FIG. 5A-5C illustrate an example of a population of two-state memory cells (Single Level Cells, or "SLC" cells). FIG. 5A illustrates how the population of memory cells are programmable into two distinct distributions of threshold voltages, an erased state, "E" and a programmed state, "P." Memory cells may be read by determining whether their threshold voltages are above or below a read voltage, rV1. FIG. 5B illustrates the initial distribution of "erased" threshold voltages for an erased memory. FIG. 5C illustrates an example of the memory after the memory cells have been programmed. Essentially, a cell initially has an "erased" threshold voltage and programming will move it to a higher value into a zone demarcated by verify level vV1. In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

FIG. 6A depicts one embodiment of a set of threshold voltage distributions for a four-state memory device in which each storage element stores two bits of data. A first threshold voltage (Vth) distribution 600 is provided for erased (Er-state) storage elements. Three Vth distributions 602, 604 and 606 represent programmed states A, B and C, respectively. In one embodiment, the threshold voltages in the Er-state and the threshold voltages in the A, B and C distributions are positive. In another embodiment, the threshold voltage distribution for the Er-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the Er-state directly to any of the programmed states A, B or C. For example, a population of storage elements to be programmed may first be erased so that all storage elements in the population are in the Er-state. A series of program pulses may then be used to program storage elements directly into states A, B or C. While some storage elements are being programmed from the Er-state to the A-state, other storage elements are being programmed from the Er-state to the B-state and/or from the Er-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 6B:
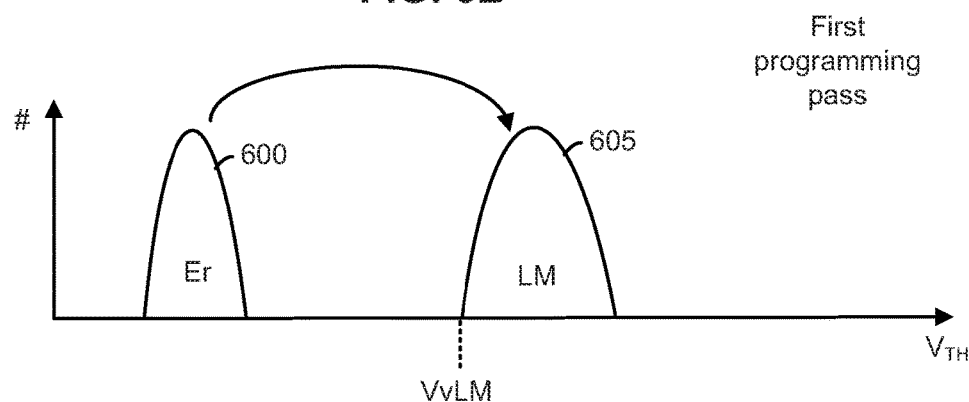
FIG. 6B depicts one embodiment of a first pass of a two-pass programming technique.

FIG. 6B depicts one embodiment of a first pass of a two-pass programming technique. In this example, a multi-state storage element stores data for two different pages: a lower page and an upper page. Four states are depicted by repeating the threshold voltage distributions 600, 602, 604 and 606 from FIG. 6A. These states, and the bits they represent, are: Er-state (11), A-state (01), B-state (00) and C-state (10). For Er-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state Er (distribution 600). If the data is to be programmed to 0, then the threshold voltage of the storage elements on WLn are raised such that the storage element is programmed to an intermediate (LM or lower-middle) state (distribution 605).

Figure 6C:
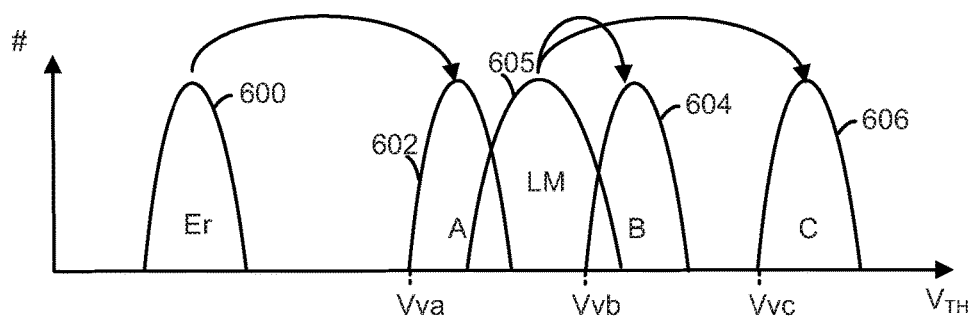
FIG. 6C depicts one embodiment of a second pass of the two-pass programming technique referred to in FIG. 6B.

FIG. 6C depicts one embodiment of a second pass of the two-pass programming technique referred to in FIG. 6B. The A-state storage elements are programmed from the Er-state distribution 600 to the A-state distribution 602, the B-state storage elements are programmed from the LM-state distribution 605 to the B-state distribution 604, and the C-state storage elements are programmed from the LM-state distribution 605 to the C-state distribution 606.

Figure 6D:
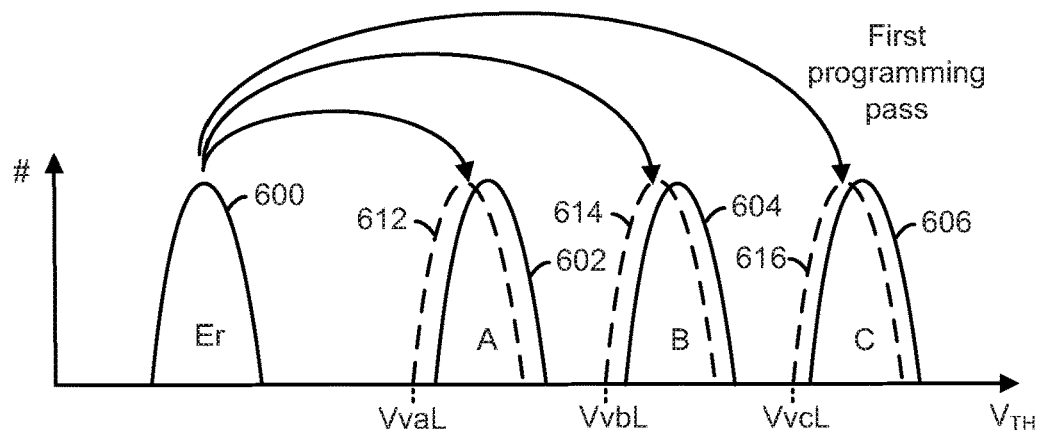
FIG. 6D depicts one embodiment of a first pass of another two-pass programming technique.

FIG. 6D depicts one embodiment of a first pass of another two-pass programming technique. In this example, referred to as foggy-fine (or course-fine) programming, the A-state, B-state and C-state storage elements are programmed from the Er-state to distributions 612, 614 and 616, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 6E:
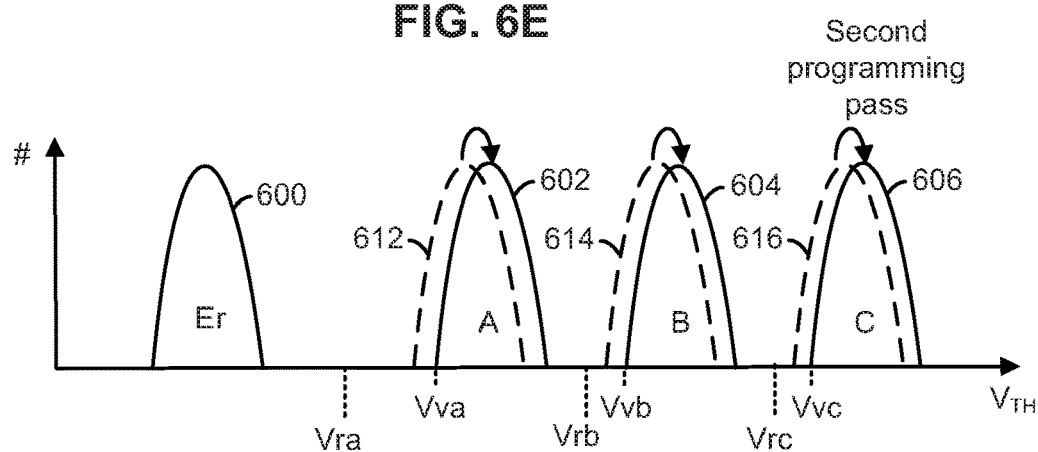
FIG. 6E depicts one embodiment of a second pass of the two-pass programming technique referred to in FIG. 6D.

FIG. 6E depicts one embodiment of a second pass of the two-pass programming technique referred to in FIG. 6D. The A-state, B-state and C-state storage elements are programmed from the respective lower distributions to respective final distributions 602, 604 and 606, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state. Programming techniques which measure storage element current may be used as well. The concepts described herein may be adapted to the different programming techniques.

Figure 6F:
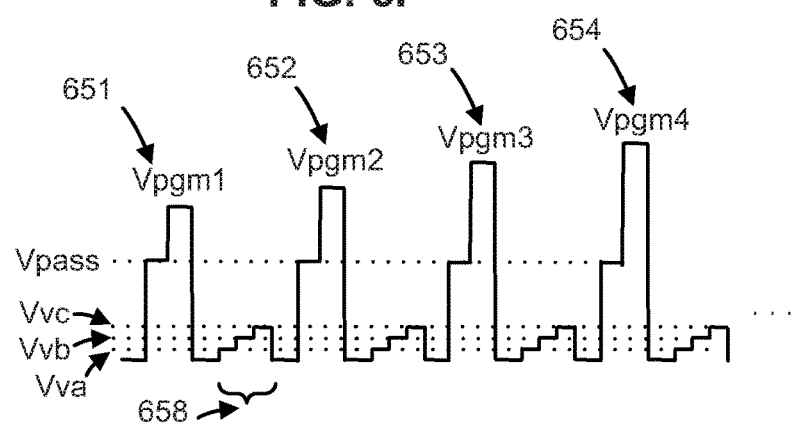
FIG. 6F depicts one embodiment of a series of program and verify pulses which are applied to a selected word line during a programming operation.
Figure 6G:
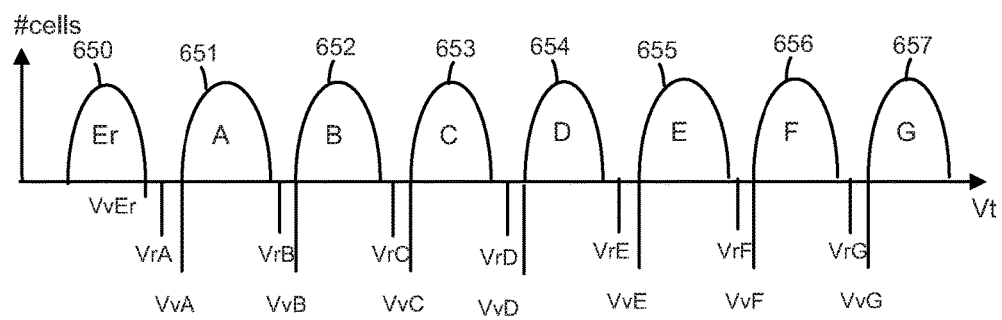
FIG. 6G shows eight VT distributions corresponding to an Erase state (Er) and programmed states A-G.
Figure 6H:
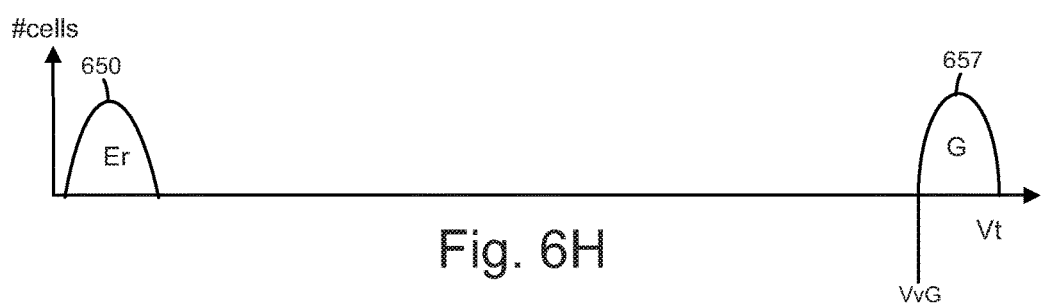
FIG. 6H depicts an example of two threshold distributions used for programming a temperature code into system memory cells, in one embodiment.

FIG. 6F depicts one embodiment of a series of program and verify pulses which are applied to a selected word line during a programming operation. A programming operation may include multiple program-verify iterations, in which each iteration applies one or more programming voltages followed by one or more verify voltages to the selected word line. In one embodiment, the programming voltages applied in a previous iteration may be stepped up in successive iterations. Moreover, the one or more programming voltages applied during a programming iteration may include a first portion which has a pass voltage (Vpass) level, e.g., 6-8 V, followed by a second, highest amplitude portion at a program level, e.g., 12-25 V. For example, a first, second, third and fourth program pulses 651, 652, 653 and 654 have program levels of Vpgm1, Vpgm2, Vpgm3 and Vpgm4, respectively. One or more verify voltages 658, such as verify voltages Vva, Vvb and Vvc, may be provided after each program pulse. In some cases, one or more initial program pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

More than one bit may be stored in a memory cell. For example, when two bits are stored per memory cell there may be four distinct distributions of threshold voltages. When three bits are stored per memory cell there may be eight distinct distributions of threshold voltages. FIG. 6G shows eight VT distributions 650-657 corresponding to an Erase state (Er) and programmed states A-G. In one embodiment, the threshold voltages in the Erase state are negative and the threshold voltages in the programmed states A-G are positive. However, the threshold voltages in one or more of programmed states A-G may be negative. Some or all of the threshold voltages in the Erase state could be positive.

At or near the lower edge of the threshold distribution for each programmed state is a verify reference voltage. For example, FIG. 6G shows VvA for the A-state, VvB for the B-state, VvC for the C-state, VvD for the D-state, VvE for the E-state, VvF for the F-state, and VvG for the G-state. When programming memory cells to a given state, the control circuit will test whether those memory cells have a threshold voltage greater than or equal to the verify reference voltage.

Between each adjacent pair of the VT distributions are read reference voltages used for reading data from memory cells. For example, FIG. 6G shows read reference voltage VrA between the erase state and the A-state, VrB between the A-state and B-state, VrC between the B-state and C-state, VrD between the C-state and D-state, VrE between the D-state and E-state, VrF between the E-state and F-state, and VrG between the F-state and G-state. By testing whether the threshold voltage of a given memory cell is above or below the respective read reference voltages, the control circuit can determine what state the memory cell is in. For example, a memory cell whose threshold voltage is greater than VrD, but less them VrE may be assumed to be in the D-state.

In full sequence programming, storage elements can be programmed from the Erased-state directly to any of the programmed states A, B, C, D, E, F, or G in a single programming phase. For example, a population of storage elements to be programmed may first be erased so that all storage elements in the population are in the Erased-state. A series of program pulses is used to program storage elements directly into the A-, B- C-, D-, E-, F-, or G-states in a single programming phase. While some storage elements are being programmed from the Erased-state to the A-state, other storage elements are being programmed from the Erased-state to the B-state, from the Erased-state to the C-state, from the Erased-state to the D-state, from the Erased-state to the E-state, from the Erased-state to the F-state, and/or from the Erased-state to the G-state.

For a memory cell being programmed to the A-State, when the threshold voltage reaches VvA, the storage element is locked out from further programming, in one embodiment. Similarly, when the threshold voltage of a B-state storage element exceeds VvB, the storage element is locked out from further programming, in one embodiment. Memory cells to be programmed to the C-, D-, E-, F-, and G-state may also be locked out upon reaching their respective target threshold voltages, in one embodiment.

FIG. 6H depicts an example of two threshold distributions used for programming a temperature code into system memory cells, in one embodiment. In this embodiment, only the Er-state 650 and G-state 657 are used for storing the temperature code. Other states may be used instead to store the temperature code into system memory cells. Further details are discussed below.

Figure 7:
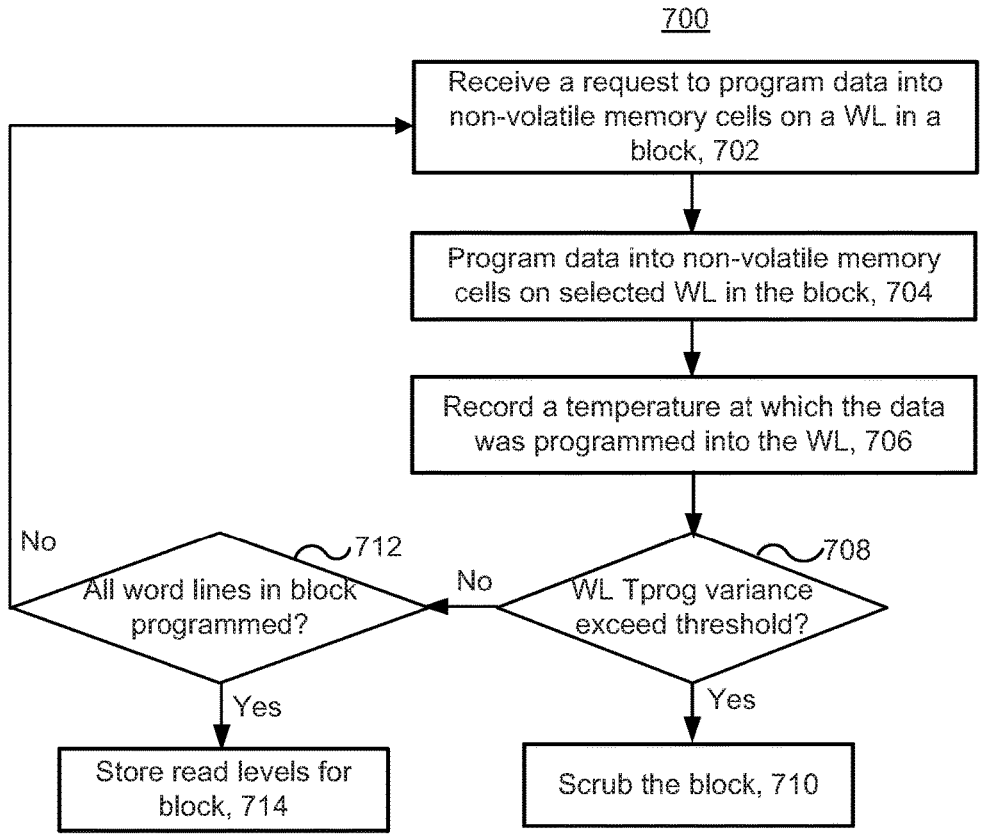
FIG. 7 is a flowchart of one embodiment of a process of programming a block of non-volatile memory cells.

FIG. 7 is a flowchart of one embodiment of a process 700 of programming a block of non-volatile memory cells. In one embodiment, process 700 is performed in memory system 100 by one or more control circuits (e.g., controller 122, processor 122c, ECC engine 224, state machine 112, on-chip address decoder 114, temp-sensing circuit 115, power control 116, read/write circuits 128, decoders 124, 132, and/or sense block (51, 52, . . . 53). In one embodiment, process 700 is performed in memory system 100 by data programmer 1312, TEMPCODE programmer 1314, data encoder/decoder 256/244, TEMPCODE reader 1318, temperature sensor 115, Tprog (programming temperature) analyzer 1324, scrubber 1322, and/or read voltage level selector 1320, depicted in FIG. 13.

Process 700 prevents extreme variations in programming temperatures for different word lines in a block. Extreme variations in WL programming temperatures can potentially make it difficult to use the same read voltage levels for all word lines in the block. Extreme variations in WL programming temperatures can also potentially increase the BER when reading memory cells in the block.

Step 702 includes receiving a request to program data into non-volatile memory cells associated with a word line in a block. Step 702 may be triggered by a host 140 sending a request to controller 122 to program data associated with some logical address. The controller 122 may translate the logical address to a physical address, and send a command to a memory die 108 to program memory cells on a selected word line in a block of non-volatile memory cells.

Step 704 includes programming data into non-volatile memory cells on the selected word line in the block. In one embodiment, process 400 is used to program the data.

Step 706 includes recording a temperature at which the data was programmed into the memory cells associated with the selected word line. In one embodiment, a temperature code is programmed into system memory cells associated with the selected word line.

Step 708 is a determination of whether the word line program temperature variance within the block exceeds a threshold. In one embodiment, the threshold is based on an ability to successfully decode data that is read out of the block using the same set of read voltage levels for all word lines in the block. For example, if the word line program temperature variance is too high, then a decode process (e.g., step 1114 of FIG. 11) may be likely to fail to successfully decode using the same set of read voltage levels (e.g., block read levels in step 1102 of FIG. 11) for all word lines in the block. However, note that in some cases, the decode process (e.g., step 1114 of FIG. 11) may still fail if the block is not scrubbed in step 710. Thus, it is not required to set the threshold to guarantee that the decode process (e.g., step 1114 of FIG. 11) will succeed.

Numerous ways can be used to determine whether the word line program temperature variance within the block exceeds the threshold. One technique is to compare the WL program temperature for two word lines in the block. If the difference in WL program temperature is more than a permitted amount, then the variance within the block exceeds the threshold, in this technique. This could be the word line presently programmed and the last word line programmed, but is not limited to these two word lines. It could be the word line presently programmed and any of the other word lines in the block.

Other techniques can also be used to determine whether the word line program temperature variance within the block exceeds a threshold. In one embodiment, the mathematical variance of the WL program temperatures in the block is calculated. If the mathematical variance is more than a permitted amount, then the word line program temperature variance within the block exceeds the threshold, in this technique. Note that the mathematical variance may be based on more than two word lines in the block.

In response to there being a high word line program temperature variance, the block is scrubbed in step 710. In one embodiment, the data is read in to the controller, such that the controller can perform error correction on the data to generate "clean data." Then, the clean data may be re-written to the memory array 126. One option is to re-write the data in place. That is, the data can be written to the same block. However, re-writing in place in not required. Instead, the clean data could be written to another block. Note that the scrub operation can be delayed until the host 140 is not accessing the memory array 126, to avoid interference with performance.

On the other hand, if it is determined in step 708 that at this time there is not a high WL program temperature variance in the block, then the process goes to step 712. Step 712 is a determination of whether the all word lines in the block have been programmed. If so, then read voltage levels for the block are stored in step 714. This set might be based on the number of program/erase cycles for the block, the average of the WL program temperatures, or other factors.

If there are more word lines in the block to be programmed (step 712=no), then the process eventually receives a request to program data into another word line in the block, in step 702. The process 700 continues until either the block is scrubbed, or the block is fully written. Note that the decision to scrub the block can be made after all of the word lines in the block have been programmed.

Figure 8:
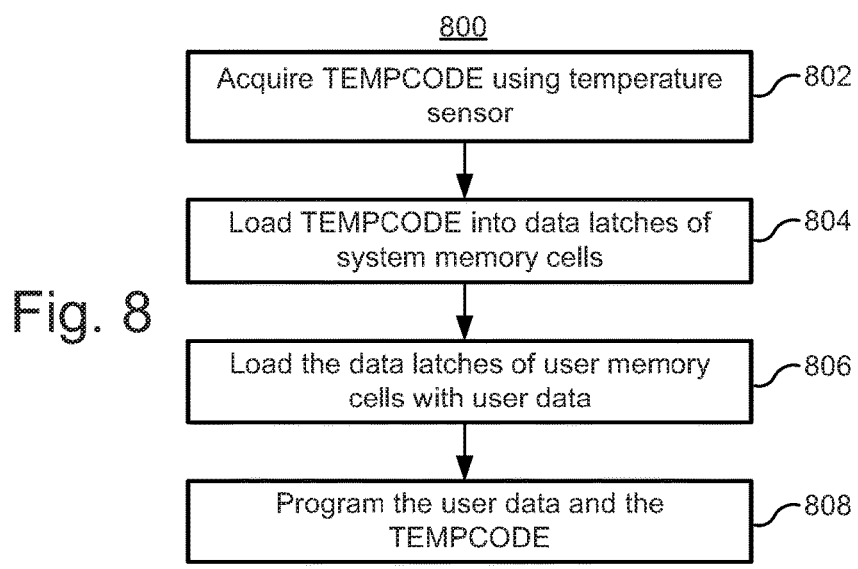
FIG. 8 is a flowchart of one embodiment of a process of programming a temperature code into non-volatile memory cells on a selected word line, while also programming user data into memory cells on the selected word line.

FIG. 8 is a flowchart of one embodiment of a process 800 of programming a temperature code into non-volatile memory cells on a selected word line, while also programming user data into memory cells on the selected word line. This process provides further details for one embodiment of steps 704 and 706 of process 700. In one embodiment, process 800 is performed in memory system 100 by one or more of controller 122, processor 122c, ECC engine 224, state machine 112, on-chip address decoder 114, temp-sensing circuit 115, power control 116, read/write circuits 128, decoders 124, 132, and/or sense block (51, 52, . . . 53). In one embodiment, process 800 is performed in memory system 100 by data programmer 1312, TEMPCODE programmer 1314, data encoder/decoder 256/244, and/or temperature sensor 115, depicted in FIG. 13.

Step 802 includes accessing a TEMPCODE using a temperature sensor 115. The TEMPCODE is a binary string, in one embodiment.

Step 804 includes loading the TEMPCODE into data latches of system memory cells. FIG. 2B depicts an example of data latches 194 in a sense block. Each memory cell is associated with a sense block, and hence data latches 194, in one embodiment. Each set of latches 194 has three latches (151, 152, 153) in the example of FIG. 2B. These three latches are suitable for storing up to three bits per memory cell. There could be more or fewer than three data latches per set. Also note that four sets 194(0)-194(3) of data latches are depicted in FIG. 2B. Each set is for a different bit line (BL0-BL3), and hence is for a different memory cell. In one embodiment, each set 194 is used to store the information for one bit in the TEMPCODE. Further details are discussed with respect to process 1000 in FIG. 10.

Step 806 includes loading the user data into data latches associated with user memory cells. Note here that the user data may be a codeword that was formed by controller 122. Thus, the user data may include both the raw user data from the host 140 and parity bits calculated by the controller 122. In the example of the latches of FIG. 2B, the LDL latch 151 receives the bit for a lower page, the MDL latch 152 receives the bit for a middle page, and the UDL latch 153 receives the bit for an upper page. As noted above, three bits per user memory cell is just one example. The user memory cells could store one bit, two bits, three bits, four bits, or some other number of bits each.

Step 808 includes programming the user data and the TEMPCODE at the same time. This may include performing steps 402-416 of process 400. Note that during each iteration of step 404, the program voltage that is applied to the selected word line may be applied to the control gates of both user memory cells (to program the user data) and system memory cells (to program the TEMPCODE). This is one example of programming the user data and the TEMP-CODE at the same time. Also, during step 406, the verify voltages that are applied to the selected word line may be applied to the control gates of both user memory cells (to program the user data) and system memory cells (to program the TEMPCODE). This is one example of program verifying the user data and the TEMPCODE at the same time. The result for programming the user data could be two threshold voltage distributions such as in FIG. 5C; four threshold voltage distributions such as in FIG. 6A; eight threshold voltage distributions such as in FIG. 6G, or some other number of threshold voltage distributions.

The TEMPCODE is programmed to one bit per system memory cell, in one embodiment. The result for programming the user data could be two threshold voltage distributions such as in FIG. 5C. In one embodiment, both the user memory cells and the system memory cells are programmed to two threshold voltage distributions such as in FIG. 5C.

However, in some embodiments, the TEMPCODE is programmed to one bit per system memory cell while the user data is programmed to multiple bits per memory cell in the user memory cells. As one example, the TEMPCODE is programmed to two threshold voltage distributions such as in FIG. 6H, while at the same time the user data is programmed to eight threshold voltage distributions such as in FIG. 6G. Note that the TEMPCODE is programmed to the highest data state (in terms of magnitude of threshold voltage) in this example. This provides for a very large separation between the two data states (e.g., Er-state 650 and G-state 657). Another alternative is to program the TEMPCODE to the F-state 656, instead of the G-state 657. This also provides for a very large separation between the two data states (e.g., Er-state 650 and F-state 656). It is not required that the TEMPCODE be programmed to a specific state to which the user memory cells are programmed.

As another example, the user data is programmed to four threshold voltage distributions such as in FIG. 6A, while the TEMPCODE is programmed to two of those four threshold voltage distributions (e.g., Er state 600 and C-state 606).

Note that these examples are referred to programming the TEMPCODE to one bit per system memory cell because only two of the threshold voltage distributions (which are examples of data states) are used.

Many other possibilities exist for programming the TEMPCODE to one bit per system memory cell while at the same time programming the user memory cells to multiple bits per memory cell. In one embodiment, the TEMPCODE is programmed to the highest data state (in terms of magnitude of threshold voltage) and the lowest data state used for the user memory cells. In one embodiment, at least two of the data states used to program the user memory cells are not used to program the TEMPCODE in the system memory cell. Moreover, those two data states are between (in terms of magnitude of threshold voltage) the states used to program the TEMPCODE. In one embodiment, at half of the data states used to program the user memory cells are not used to program the TEMPCODE in the system memory cell. Moreover, those half of the data states are between (in terms of magnitude of threshold voltage) the states used to program the TEMPCODE.

A variety of programming techniques can be used in step 808. In one embodiment, both the user data and the TEMP-CODE are programmed (to the user memory cells and system memory cells, respectively) using a direct programming scheme, such as the example of FIGS. 6D and 6E. Note that the direct programming scheme may be used for more than four data states for the user memory cells. Note that the direct programming scheme may also be referred to as a foggy-fine programming scheme.

In one embodiment, both the user data and the TEMP-CODE are programmed (to the user memory cells and system memory cells, respectively) using one or more intermediate threshold voltage distributions, such as the example of FIGS. 6B and 6C. Note that the intermediate programming scheme may be used for more than four data states for the user memory cells.

Figure 9:
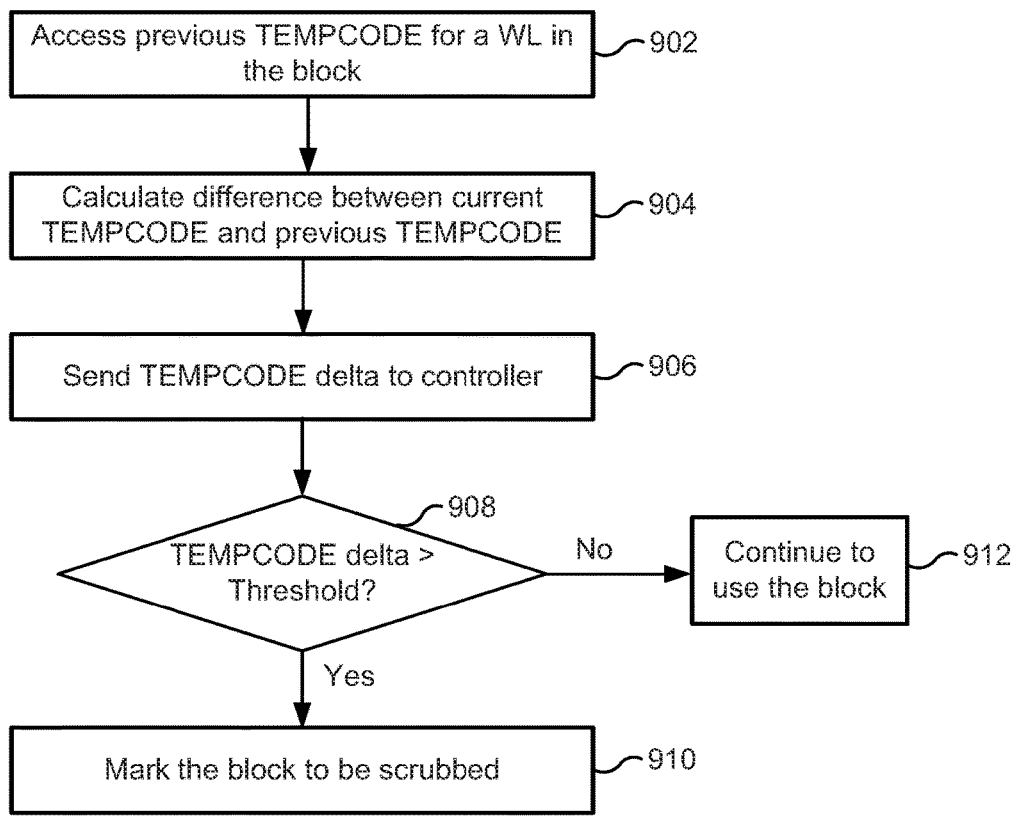
FIG. 9 is a flowchart of one embodiment of a process of determining whether to scrub a block.

FIG. 9 is a flowchart of one embodiment of a process 900 of determining whether to scrub a block. In one embodiment, process 900 is performed in memory system 100 by one or more of controller 122, processor 122c, state machine 112, on-chip address decoder 114, temp-sensing circuit 115, power control 116, read/write circuits 128, decoders 124, 132, and/or sense block (51, 52, . . . 53). In one embodiment, process 900 is performed in memory system 100 by TEMP-CODE reader 1318, Tprog analyzer 1324, and/or temperature sensor 115, depicted in FIG. 13. Process 900 provides further details for one embodiment of step 708 of process 700. Process 900 may be performed upon programming a selected word line in a block. In step 902, a TEMPCODE for a previously programmed word line in the block is accessed. In one embodiment, this is the most recently programmed WL. However, it could be the TEMPCODE for any previously programmed word line in the block.

Step 904 includes calculating the difference between the current TEMPCODE (for the WL currently being programmed in the block) and the previous TEMPCODE (for a WL in the block other than the one presently being programmed). In one embodiment, step 904 is performed on-chip, by circuitry in the memory die. In one embodiment, step 904 is performed by the controller 122.

Step 906 includes sending the TEMPCODE delta to the controller 122. This step may be skipped if the controller 122 calculates the delta.

Step 908 includes determining whether the TEMPCODE delta is greater than a threshold. If so, then in step 910 the block is marked to be scrubbed. The block need not be scrubbed at the present time. Rather, the memory controller 122 could add the block to a list of blocks to be scrubbed when scrubbing the block will not interfere with memory system performance.

In one embodiment, the threshold of step 908 is set based on an ability to establish read voltage reference levels that can be used to reliably read (and successfully decode) the data stored in the non-volatile memory cells on different word lines in the block. In one embodiment, when the TEMPCODE delta is below the threshold, the memory system 100 is able to establish read voltage reference levels for reading non-volatile memory cells on different word lines in the block (at, for example, the present temperature) and successfully decode the data using a decoding algorithm. For example, if the TEMPCODE delta is too high, then a decode process (e.g., step 1114 of FIG. 11) may be likely to fail to successfully decode using the same set of read voltage levels (e.g., block read levels in step 1102 of FIG. 11) for the two word lines referred to in process 900. However, note that in some cases, the decode process (e.g., step 1114 of FIG. 11) may still fail if the block is not marked to be scrubbed in step 910. Thus, it is not required to set the threshold to guarantee that the decode process (e.g., step 1114 of FIG. 11) will succeed for both word lines in process 900.

Note that the memory system may employ more than one decoding algorithm, with a (typically) more time consuming decoding algorithm being used only if a more basic decoding algorithm fails. For example, in process 1100, if the decoding fails in step 1120, then a (typically) more time consuming algorithm may be used in step 1124. Thus, in one embodiment, the threshold may be set based on whether step 1120 passes (after attempting different read voltage reference levels in step 1118). However, when the TEMPCODE delta is above the threshold, the memory system 100 is not able to establish read voltage reference levels for reading the non-volatile memory cells on different word lines in the block (at, for example, the present temperature) and to successfully decode the data using a decoding algorithm.

If the TEMPCODE delta is not greater than the threshold (step 908=no), then the block is continued to be used, as indicated by step 912.

Figure 10:
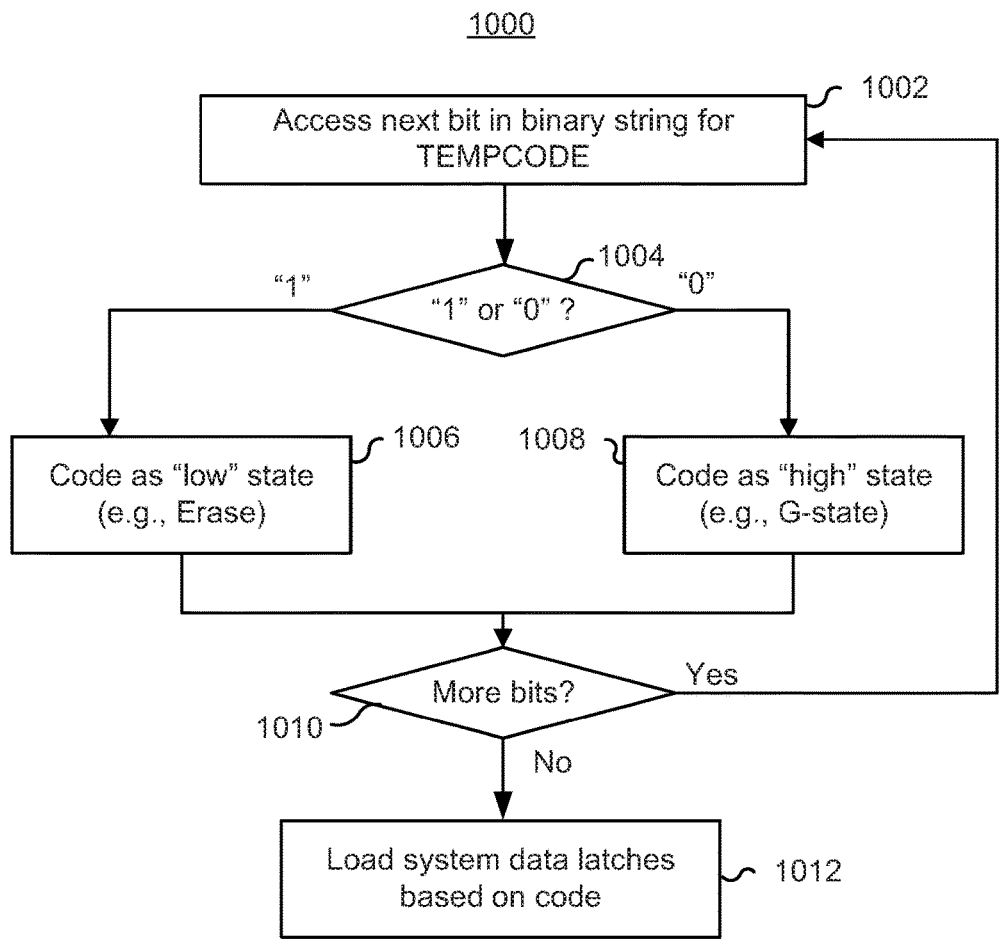
FIG. 10 is a flowchart of one embodiment of a process of programming a TEMPCODE into system memory cells on a word line that has been selected for programming.

FIG. 10 is a flowchart of one embodiment of a process 1000 of programming a TEMPCODE into system memory cells on a word line that has been selected for programming. Process 1000 is one embodiment of step 706 of process 700. Process 1000 may be performed by controller 122, state machine 112, on-chip address decoder 114, read/write circuits 128, and/or decoders 124, 132, in one embodiment. In one embodiment, process 1000 is performed in memory system 100 by TEMPCODE programmer 1314, and/or temperature sensor 115, depicted in FIG. 13. Process 1000 assumes that the TEMPCODE is available as a binary string. The TEMPCODE might be stored in a register on the memory die. Process 1000 can be used while simultaneously programming user data into user memory cells. The user data might be programmed at two-, three-, four- or more bits per memory cell. Thus, there might be, for example, two, four, eight, sixteen, or more data states for user data. In process 1000, the TEMPCODE is programmed using two of those data states.

Step 1002 is to access the next bit in the binary string. Step 1004 is a determination of whether the bit is a "1" or a "0". If the bit is a "1", then it is coded as a "low" state, in step 1006. For example, the bit may be coded as the erase state. As one example, the "1" is coded as "111" for the low data state. The low state is not required to be the lowest in terms of magnitude of threshold voltage. Also, any coding scheme may be used for the data states.

If the bit is a "0", then it is coded as a "high" state, in step 1008. For example, the bit may be coded as the G-state if there are eight data states for the user data. As one example, the "0" is coded as "000" for the high data state. The high state is not required to be the highest in terms of magnitude of threshold voltage. For example, the high state could be the E-state. Also, any coding scheme may be used for the data states. Thus, the high state need not be encoded as a "111". As another example, the high data state might be the C-state if there are four data states for the user data.

Step 1010 is a determination of whether there are more bits in the binary string of the TEMPCODE. If so, the process returns to step 1002 for the next bit. When all bits have been coded, the process moves on to step 1012.

In step 1012, the system data latches are loaded with the codes from steps 1006 and 1008. For example, with reference to the latches 194 in FIG. 2B, the LDL 151, MDL 152, and UDL 153 latches in set 194(0) are each loaded with a "0" to represent a "0" in the binary string; latches in set 194(1) are each loaded with a "0" to represent a "0" in the binary string; latches in set 194(2) are each loaded with a "1" to represent a "1" in the binary string; and latches in set 194(3) are each loaded with a "0" to represent a "0" in the binary string. Of course, the coding could be different from this example. For example, if the high state is coded as "101," the loading of the latches would be "1" for LDL 151, "0" for MDL 152, and "1" for UDL 153.

The latches 194 for the user memory cells may be loaded at the same time as the latches for the system memory cells. Once all of the latches are loaded, programming may proceed. Thus, the system memory cells may be programmed as the same time as the user memory cells.

For added reliability, the TEMPCODE may be stored more than one set of system memory cells. For example, if the binary string is eight bits, a first set of eight system memory cells may be programmed as described in process 1000 to store the TEMPCODE once. A second set of eight system memory cells may be programmed as described in process 1000 to store a redundant version of the TEMPCODE.

In one embodiment, a compliment of the TEMPCODE is also stored in system memory cells. For example, in step 1004, the "0s" may be coded as the low data state, and the "1s" may be coded as the high data state. This compliment of the TEMPCODE may be stored in another set of, for example, eight system memory cells. Redundant versions of the compliment of the TEMPCODE may be stored in still another set of, for example, eight system memory cells.

In one embodiment, the memory system 100 may compare the various versions of the TEMPCODE stored in system memory cells on a selected word line to correct a possible error that might arise due to cross temperature effects.

Figure 11:
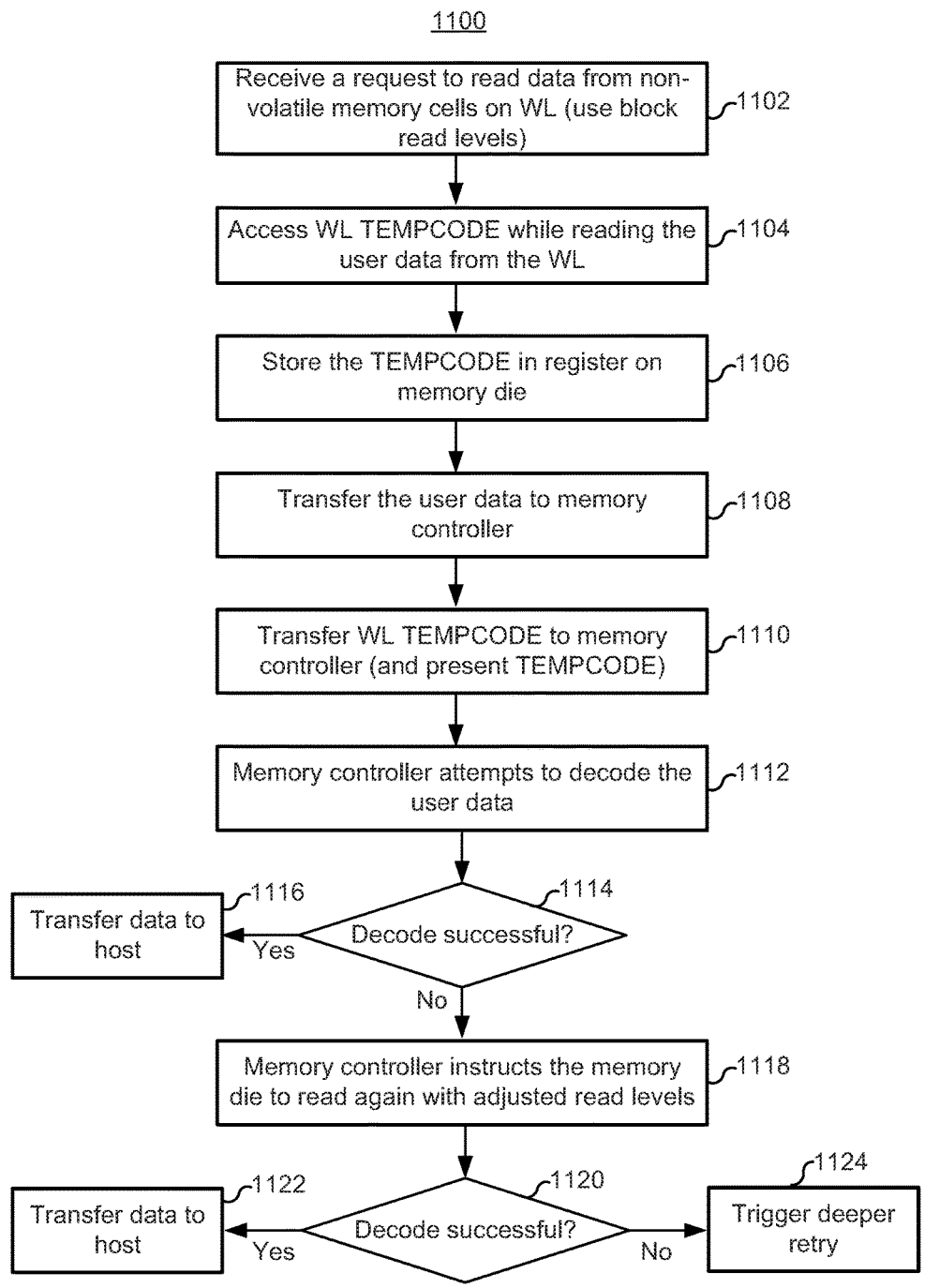
FIG. 11 is a flowchart of one embodiment of a process of reading and decoding memory cells.

FIG. 11 is a flowchart of one embodiment of a process 1100 of reading and decoding memory cells. This process may be used in connection with a process that stores a TEMPCODE in system memory cells, the TEMPCODE being for the WL programming temperature. For example, process 1100 may be used to read data that was programmed using process 700. Process 1100 may be performed by controller 122, state machine 112, on-chip address decoder 114, temp-sensing circuit 115, power control 116, read/write circuits 128, ECC 224, and/or decoders 124, 132, in one embodiment. In one embodiment, process 1100 is performed in memory system 100 by data encoder/decoder 256/244, TEMPCODE reader 1318, read voltage level selector 1320, Tprog analyzer 1324, and/or temperature sensor 115, depicted in FIG. 13.

Step 1102 includes receiving a request to read data from non-volatile memory cells on a selected word line. This request may have been triggered by a read command from host 140. The controller 122 may translate a logical address in the host read command to a physical address in the memory array 126. The controller 122 may send a read request to the memory die, with the physical address. The selected word line and block may be indicated by the physical address.

Step 1104 includes accessing a WL TEMPCODE from system memory cells while reading user data from user memory cells on the selected word line. An example in which the user data is stored using the threshold voltage ranges in FIG. 6G and the TEMPCODE is stored using the threshold voltage ranges in FIG. 6H will be discussed to illustrate. The read reference voltages corresponding to VrA, VrB, VrC, VrD, VrE, VrF, and VrG may be applied to the selected word line. Note that the exact values for these read reference voltages is not fixed. In one embodiment, the memory system stores default values for the block when programming of the entire block is finished. These default values may be used in step 1104. However, it is not required to use those default values in step 1104. For example, the values can be adjusted based on the present temperature, number of program/erase cycles for the block, etc.

Note that the TEMPCODE can be sensed based on any of the read reference voltages corresponding to VrA, VrB, VrC, VrD, VrE, VrF, and VrG. Thus, it is not required that the VrG level is used merely because the G-state was used (in the example of FIG. 6H). In one embodiment, a read reference voltage level that is about midway between the two states is used to determine which state the system memory cell is in. For example, the system memory cells might be sensed in response to applying the VrD read reference voltage level to the selected word line.

Step 1106 includes storing the TEMPCODE in a register on the memory die 108. In one embodiment, the result of sensing each system memory cell is either a "1" or a "0", depending on whether the system memory cell conducts a current in response to whatever read reference voltage level is used. Note that this result can be transferred directly to a register on the memory die. That is, there is no need to send the raw data to the controller 122 to be decoded.

Step 1108 includes transferring the user data to the controller 122. The user data may be a codeword, which contains parity bits. Step 1110 includes transferring the WL TEMPCODE to the controller. A TEMPCODE for the present temperature of the memory die may also be transferred to the controller. An alternative is to simply transfer a single TEMPCODE that represents the cross temperature.

Step 1112 includes the controller attempting to decode the codeword (e.g., the user data and parity bits). If decoding is successful, then the data may be transferred to the host 140, in step 1116.

If decoding is unsuccessful, then the memory controller instructs the memory die to read the selected word line again with adjusted read levels, in step 1118. The read levels are adjusted to factor in the cross temperature. If decoding is successful on this attempt, then the data may be transferred to the host 140, in step 1122. If decoding is again unsuccessful, then other techniques may be used to attempt to sense and/or decode the data, in step 1124.

Figure 12:
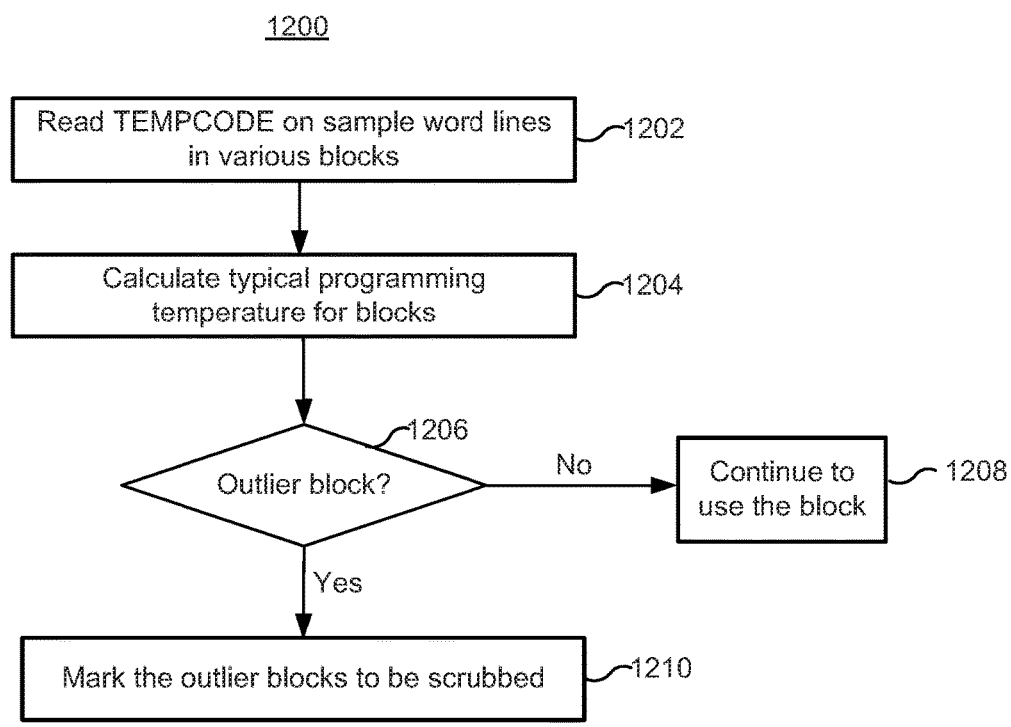
FIG. 12 is a flowchart of one embodiment of a process of scrubbing blocks that are outliers in terms of programming temperature.

FIG. 12 is a flowchart of one embodiment of a process 1200 of scrubbing blocks that are outliers in terms of programming temperature. The process 1200 may be used in combination with a process that records a TEMPCODE in system memory cells, the TEMPCODE being for the WL programming temperature. For example, process 1200 may be used in combination with process 700. Process 1200 may be performed by controller 122, state machine 112, on-chip address decoder 114, power control 116, read/write circuits 128, and/or decoders 124, 132, in one embodiment. In one embodiment, process 1200 is performed in memory system 100 by TEMPCODE reader 1318, Tprog analyzer 1324, scrubber 1322, and/or temperature sensor 115, depicted in FIG. 13.

Step 1202 includes reading the TEMPCODE on sample word lines in various blocks. In one embodiment, two word lines are sampled per block. However, more or fewer than two word lines can be sampled. Step 1202 may also read user memory cells on the sample word lines. In one embodiment, the memory system 100 periodically samples word lines in various blocks to determine the integrity of the data stored therein. For example, the memory system periodically determines a BER for sample word lines, and takes appropriate action responsive to the BER. In one embodiment, the memory system periodically samples word lines in various blocks to determine whether better read reference voltage levels could be used for the blocks. In one embodiment, the TEMPCODE is read along with the user memory cells in one or more such processes. Since the TEMPCODE can be read with the user memory cells, no extra time is needed.

Step 1204 includes calculating typical programming temperature range for the sampled blocks. For example, the memory die sends the WL TEMPCODES to the memory controller, which calculates a range of temperatures that characterizes the typical WL programming temperatures.

Step 1206 includes determining whether there are any outlier blocks, with respect to the WL programming temperature. An outlier block may be defined as one having at least one word line with a WL programming temperature that is outside the typical programming temperatures. Alternatively, an outlier block may be defined as having an average WL programming temperature that is outside the typical programming temperatures. In one embodiment, the outlier blocks are defined based on an ability to establish read reference voltage levels that can be used to reliably read and decode data. For example, the memory system 100 may be unable to establish read reference voltage levels that can be used to read and decode data in the outlier blocks at the present temperature, without resort to a deeper (and more time-consuming) decoding process (e.g., step 1124), in one embodiment.

Outlier blocks are marked to be scrubbed, in step 1210. For example, such blocks are added to a list of blocks to be scrubbed when it is convenient. Blocks that are not outliers are continued to be used, as indicated in step 1208.

The WL program temperature information may be helpful to perform diagnostics in the event that there is some sort of memory system failure or problem. For example, knowing what temperature each word line was programmed at may help to explain such memory system failures or problems.

Figure 13:
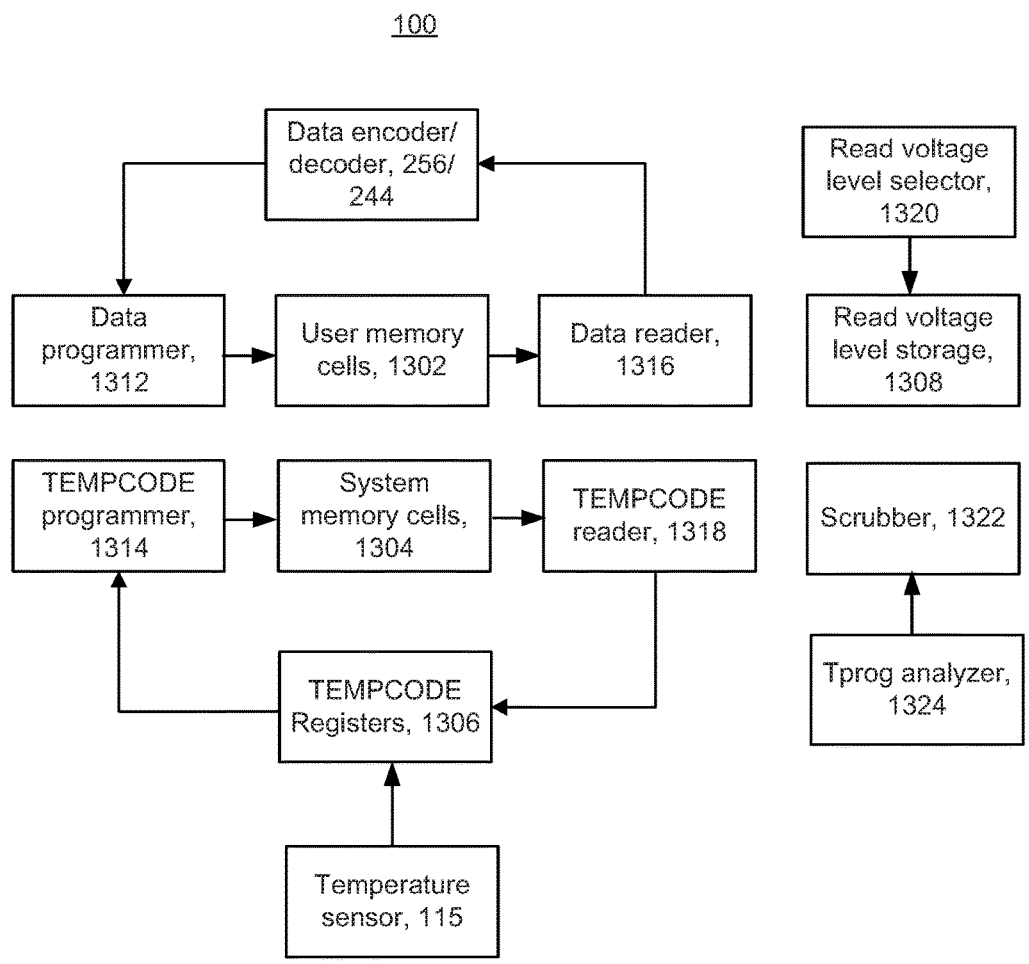
FIG. 13 is a block diagram of one embodiment of a memory system.

FIG. 13 is a block diagram of one embodiment of a memory system 100. The system can implement various processes including, but not limited to, process 700, 800, 900, 1000, 1100, and/or 1200. The system 100 has user memory cells 1302 and system memory cells 1304. In one embodiment, user memory cells 1302 and system memory cells 1304 store data based on threshold voltages. In one embodiment, user memory cells 1302 and system memory cells 1304 store data based on resistance. In one embodiment, the user memory cells 1302 are all on one group of NAND strings, and the system memory cells 1304 are all on another group (typically much smaller group) of NAND strings.

The data encoder/decoder 256/244 is configured to encode data from, for example, host 140 into codewords. The codewords may be provided to data programmer 1312, which programs the codewords into the user memory cells 1302. The data reader 1316 is configured to read the codewords from the user memory cells 1302 and provide the codewords to the data encoder/decoder 256/244. The data encoder/decoder 256/244 is configured to decode the codewords.

The temperature sensor 115 is configured to sense a temperature on the memory die and to store a binary string for the temperature code in TEMPCODE registers 1306. TEMPCODE programmer 1314 is configured to access the TEMPCODE for a selected word line and program it into system memory cells 1304 on the selected word line. The TEMPCODE reader 1318 is configured to read the TEMPCODE for a selected word line from the system memory cells 1304 and store it into TEMPCODE registers 1306.

Read voltage level storage 1308 stores values for different sets of read reference voltages. The read voltage level selector 1320 is configured to select a set of read reference voltage from storage 1308. The read voltage level selector 1320 may make this selection based on the WL temperature code.

The Tprog (programming temperature) analyzer 1324 is configured to analyze temperatures at which word lines were programmed, as well as to analyze temperatures at which blocks are programmed. The Tprog analyzer 1324 is configured to determine whether a block should be scrubbed, based on WL programming temperatures, in one embodiment. The Tprog analyzer 1324 is configured to determine whether a block should be scrubbed, based on whether the block is an outlier in terms of programming temperature, in one embodiment. The scrubber 1322 is configured to scrub blocks of memory cells. The scrubber 1324 may do so responsive to a signal from Tprog analyzer 1324.

The data programmer 1312 can be implemented with circuitry such as, but not limited to, state machine 112, on-chip address decoder 114, power control 116, read/write circuits 128, sense block 51, 52, . . . , row decoder 124, column decoder 132. The TEMPCODE programmer 1314 can be implemented with circuitry such as, but not limited to, state machine 112, on-chip address decoder 114, power control 116, read/write circuits 128, sense block 51, 52, . . . , row decoder 124, column decoder 132.

The data reader 1316 can be implemented with circuitry such as, but not limited to, state machine 112, on-chip address decoder 114, power control 116, read/write circuits 128, sense block 51, 52, . . . , row decoder 124, and/or column decoder 132. The TEMPCODE reader 1318 can be implemented with circuitry such as, but not limited to, state machine 112, on-chip address decoder 114, power control 116, read/write circuits 128, sense block 51, 52, . . . , row decoder 124, and/or column decoder 132.

The data encoder/decoder 256/244 may be implemented with circuitry such as, but not limited to, processor 122c and/or ECC engine 224. The data encoder/decoder 256/244 may be, for example, an LDPC encoder. The read voltage level selector may be implemented with circuitry such as, but not limited to, processor 122c and/or state machine 112. The scrubber 1322 can be implemented with circuitry such as, but not limited to, state machine 112, on-chip address decoder 114, power control 116, read/write circuits 128, sense block 51, 52, . . . , row decoder 124, column decoder 132, and/or processor 122c. The Tprog analyzer 1324 may be implemented with circuitry such as, but not limited to, state machine 112 and/or processor 122c.

Note that many of the elements in FIG. 13 may share circuitry. For example, data reader 1316 and data programmer 1312 may share common circuitry, such as circuitry that applies voltages to word lines, state machine, etc. Data programmer 1312 and TEMPCODE programmer may share common circuitry, such as circuitry that applies voltages to word lines, state machine, etc. Data reader 1316 and TEMPCODE reader 1318 may share common circuitry, such as circuitry that applies voltages to word lines, state machine, etc. Other elements in FIG. 13 may share circuitry.

One embodiment disclosed herein includes an apparatus comprising a block comprising non-volatile memory cells and word lines. Each of the non-volatile memory cells is associated with one of the word lines. The apparatus comprises a control circuit in communication with the non-volatile memory cells and the word lines. The control circuit is configured to program data into non-volatile memory cells associated with selected word lines in the block, record word line program temperatures at which the data was programmed into ones of the selected word lines, and scrub the block responsive to a determination that a variance in word line program temperatures in the block exceeds a threshold.

One embodiment disclosed herein includes a method of operating a non-volatile memory system. The method comprises programming data into user non-volatile memory cells associated with selected word lines in a block in the non-volatile memory system. The method further comprises programming temperature codes into system non-volatile memory cells associated with ones of the selected word lines. Each temperature code being for a temperature at which the data was programmed into the user non-volatile memory cells associated with the selected word line. The method also comprises scrubbing the block responsive to a determination that the difference between two of the temperature codes for different word lines in the block is more than a threshold.

One embodiment disclosed herein includes a non-volatile memory system, comprising a plurality of blocks comprising non-volatile memory cells and word lines. Each of the non-volatile memory cells is associated with one of the word lines. The non-volatile memory cells comprise user memory cells and system memory cells. The non-volatile memory system comprises data programming means for programming data into the user memory cells associated with selected word lines in ones of the blocks. The non-volatile memory system comprises temperature code programming means for programming a temperature code into the system memory cells associated with ones of the selected word lines. Each temperature code is for a temperature at which the data was programmed into the user memory cells associated with the selected word line. The non-volatile memory system comprises program temperature analyzing means for determining whether a variance in word line program temperatures in a block exceeds a threshold. The non-volatile memory system comprises scrubbing means for scrubbing any blocks for which it is determined that the variance in word line program temperatures in the block exceeds the threshold.

In one embodiment, the data programming means comprises one or more of controller 122, processor 122c, state machine 112, on-chip address decoder 114, power control 116, read/write circuits 128, and/or sense block SB. The data programming means may comprise other electronic circuitry.

In one embodiment, the temperature code programming means comprises one or more of controller 122, processor 122c, state machine 112, on-chip address decoder 114, power control 116, read/write circuits 128, and/or sense block SB. The temperature code programming means may comprise other electronic circuitry.

In one embodiment, the program temperature analyzing means comprises one or more of controller 122, processor 122c, and/or state machine 112. The program temperature analyzing means may comprise other electronic circuitry.

In one embodiment, the scrubbing means comprises one or more of scrubber 1322, state machine 112, on-chip address decoder 114, power control 116, read/write circuits 128, sense block 51, 52, . . . , row decoder 124, column decoder 132, and/or processor 122c. The scrubbing means may comprise other electronic circuitry.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. For example, examples in which memory cells are programmed based on threshold voltage can be modified to program memory cells that store information based on resistance. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a block comprising non-volatile memory cells and word lines, each of the non-volatile memory cells associated with one of the word lines; and
a control circuit in communication with the non-volatile memory cells and the word lines, the control circuit configured to:
program data into non-volatile memory cells associated with selected word lines in the block;
record word line program temperatures at which the data was programmed into ones of the selected word lines; and
scrub the block responsive to a determination that a variance in word line program temperatures in the block exceeds a threshold.

2. The apparatus of claim 1, wherein the control circuit is further configured to:
simultaneously i) program the data into non-volatile memory cells associated with a given word line at multiple bits per memory cell and ii) program a temperature code into non-volatile memory cells associated with the given word line at one bit per memory cell, the temperature code indicating the word line program temperature for the given word line.

3. The apparatus of claim 1, wherein the control circuit is further configured to:
program the data in the non-volatile memory cells associated with a given word line to at least four data states;
program all "0s" in a temperature code for the temperature at which the data was programmed in the non-volatile memory cells associated with the given word line as a first of the at least four data states; and
program all "1s" in the temperature code as a second of the at least four data states.

4. The apparatus of claim 3, wherein:
each of the at least four data states is associated with a range; and
the ranges of at least half of the data states are between the range of the first data state and the range of the second data state.

5. The apparatus of claim 1, wherein the threshold is based on an ability to successfully decode data that is read out of the block using the same set of read voltage levels for all word lines in the block.

6. The apparatus of claim 1, further comprising:
a plurality of additional blocks comprising non-volatile memory cells and word lines, wherein the control circuit is further configured to:
program data into non-volatile memory cells associated with selected word lines in the additional blocks;
program a temperature code into non-volatile memory cells associated with ones of the selected word lines, the temperature code being for the temperature at which the data was programmed into the ones of the selected word lines;
scrub ones of the additional blocks responsive to a determination that a variance in word line program temperatures in the block exceeds a threshold; and
determine a set of read voltage levels for each of the additional blocks that are not scrubbed.

7. The apparatus of claim 6, wherein the control circuit is further configured to:
receive a request to read user data from a selected word line in a selected block of the additional blocks;
sense the non-volatile memory cells associated with the selected word line using a set of read voltage levels that are common to all word lines in the selected block;
sense the temperature code stored in non-volatile memory cells associated with the selected word line; and
responsive to a failure to successfully decode the user data, sense non-volatile memory cells associated with the selected word line again with a set of read voltage levels that are adjusted based on a difference between a present temperature and the temperature at which the data was programmed in the non-volatile memory cells associated with the selected word line.

8. The apparatus of claim 6, wherein the control circuit is further configured to:
read the temperature code stored in non-volatile memory cells on one or more word lines in a sample group of the additional blocks;
calculate a temperature range that characterizes the programming temperature for the sample group of blocks, based on the temperature codes; and
scrub any blocks for which the temperature codes indicate that the block is an outlier in terms of programming temperature.

9. A method of operating a non-volatile memory system, the method comprising:
programming data into user non-volatile memory cells associated with selected word lines in a block in the non-volatile memory system;
programming temperature codes into system non-volatile memory cells associated with ones of the selected word lines, each temperature code being for a temperature at which the data was programmed into the user non-volatile memory cells associated with the selected word line; and
scrubbing the block responsive to a determination that a difference between two of the temperature codes for different word lines in the block exceeds a threshold.

10. The method of claim 9, wherein programming the data and programming the temperature code in a given selected word line comprises:
programming the temperature code in the system non-volatile memory cells associated with the given selected word line at a single bit per non-volatile memory cell while simultaneously programming the data into the user non-volatile memory cells associated with the given selected word line at multiple bits per memory cell.

11. The method of claim 10, wherein:
the temperature code comprises a binary string;
programming the data comprises programming each of the user non-volatile memory cells to one of at least four threshold voltage ranges; and
programming the temperature code comprises:
i) programming all "0s" in the binary string as a first of the at least four threshold voltage ranges; and ii) programming all "1s" in the binary string as a second of the at least four threshold voltage ranges.

12. The method of claim 11, wherein:
the first threshold voltage range is the lowest range of the at least four threshold voltage ranges; and
the second threshold voltage range is the highest range of the at least four threshold voltage ranges.

13. The method of claim 11, wherein at least half of the threshold voltage ranges are between the first threshold voltage range and the second threshold voltage range.

14. The method of claim 9, further comprising:
programming data into user non-volatile memory cells associated with selected word lines in a plurality of additional blocks in the non-volatile memory system;
programming a temperature code into system non-volatile memory cells associated with ones of the selected word lines, the temperature code being for the temperature at which the data was programmed into the ones of the selected word lines;
scrubbing blocks responsive to a determination that a difference between the temperatures at which two different word lines were programmed exceeds a threshold; and
storing read voltage reference levels for blocks that are not scrubbed.

15. The method of claim 14, further comprising:
receiving a request to read user data from a selected word line in a selected block in the non-volatile memory system;
sensing the user non-volatile memory cells and the system non-volatile memory cells associated with the selected word line using read levels that are common to all word lines in the selected block, including sensing the temperature code stored in the system non-volatile memory cells associated with the selected word line;
attempting to decode the user data that was sensed in the user non-volatile memory cells; and
responsive to the attempt failing:
adjusting the read voltage reference levels based on the difference between a present temperature and the temperature at which the data was programmed in the non-volatile memory cells associated with the selected word line; and
sensing the user non-volatile memory cells associated with the selected word line again with the adjusted read voltage reference levels.

16. The method of claim 14, further comprising:
reading the temperature code stored in system non-volatile memory cells on one or more word lines in a sample group of blocks in the non-volatile memory system;
calculating a temperature range that characterizes the programming temperature for the sample group of blocks, based on the temperature codes; and
scrubbing any blocks for which the temperature codes indicate that the block is an outlier in terms of programming temperature.

17. A non-volatile memory system, comprising:
a plurality of blocks comprising non-volatile memory cells and word lines, each of the non-volatile memory cells associated with one of the word lines, the non-volatile memory cells comprising user memory cells and system memory cells;
data programming means for programming data into the user memory cells associated with selected word lines in ones of the blocks;
temperature code programming means for programming a temperature code into the system memory cells associated with ones of the selected word lines, each temperature code for a temperature at which the data was programmed into the user memory cells associated with the selected word line;
program temperature analyzing means for determining whether a variance in word line program temperatures in a block exceeds a threshold; and
scrubbing means for scrubbing any blocks for which it is determined that the variance in word line program temperatures in the block exceeds the threshold.

18. The non-volatile memory system of claim 17, wherein:
the temperature code comprises a binary string;
the data programming means comprises means for programming each of the user memory cells to one of at least four data states; and
the temperature code programming means comprises:
i) means for programming all "0s" in the binary string as a first of the at least four data states; and
ii) means for programming all "1s" in the binary string as a second of the at least four data states.

19. The non-volatile memory system of claim 17, further comprising:
means for receiving a request to read user data from a selected word line in a selected block;
means for sensing the user memory cells and the system memory cells associated with the selected word line using read levels that are common to all word lines in the selected block, including means for sensing the temperature code stored in the system memory cells associated with the selected word line;
means for attempting to decode the user data that was sensed in the user memory cells;
means for adjusting the read levels based on a difference between a present temperature and the temperature at which the data was programmed in the user memory cells associated with the selected word line; and
means for sensing the user memory cells associated with the selected word line again with the adjusted read levels responsive to the attempt failing.

20. The non-volatile memory system of claim 17, further comprising:
means for reading the temperature code stored in system memory cells on one or more word lines in a sample group of the blocks;
means for calculating, based on the read temperature codes, a temperature range that characterizes the programming temperature for the sample group of blocks; and
means for scrubbing any blocks for which the temperature codes indicate that the block is an outlier.

* * * * *